(12) United States Patent
Takei et al.

(10) Patent No.: US 8,048,615 B2
(45) Date of Patent: Nov. 1, 2011

(54) SILICON-CONTAINING RESIST UNDERLAYER COATING FORMING COMPOSITION FOR FORMING PHOTO-CROSSLINKING CURED RESIST UNDERLAYER COATING

(75) Inventors: Satoshi Takei, Toyama (JP); Yusuke Horiguchi, Toyama (JP); Keisuke Hashimoto, Toyama (JP); Makoto Nakajima, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 33 days.

(21) Appl. No.: 12/086,167

(22) PCT Filed: Dec. 1, 2006

(86) PCT No.: PCT/JP2006/324086
§ 371 (c)(1),
(2), (4) Date: Jun. 19, 2008

(87) PCT Pub. No.: WO2007/066597
PCT Pub. Date: Jun. 14, 2007

(65) Prior Publication Data
US 2009/0162782 A1    Jun. 25, 2009

(30) Foreign Application Priority Data

Dec. 6, 2005 (JP) ................... 2005-351821

(51) Int. Cl.
*G03F 7/40* (2006.01)
*G03F 7/38* (2006.01)
*G03F 7/11* (2006.01)

(52) U.S. Cl. .............. 430/313; 430/272.1; 430/317; 430/323; 430/327; 430/316; 430/319

(58) Field of Classification Search .................. None
See application file for complete search history.

(56) References Cited

U.S. PATENT DOCUMENTS

| 3,890,149 A | 6/1975 | Schlesinger et al. |
| 5,919,599 A | 7/1999 | Meador et al. |

(Continued)

FOREIGN PATENT DOCUMENTS

EP    1 172 695 A1    1/2002

(Continued)

OTHER PUBLICATIONS

Nakayama et al, Journal of Materials Science Letters 12, year 1993, pp. 1380-1382n no month given.*

(Continued)

*Primary Examiner* — Cynthia Hamilton
(74) *Attorney, Agent, or Firm* — Oliff & Berridge, PLC

(57) ABSTRACT

There is provided an underlayer coating that is used as an underlayer of photoresists in lithography process of the manufacture of semiconductor devices and that has a high dry etching rate in comparison to the photoresists depending on the type of etching gas, does not intermix with the photoresists, and is capable of flattening the surface of a semiconductor substrate having holes of a high aspect ratio; and an underlayer coating forming composition for forming the underlayer coating. The underlayer coating forming composition for forming by light irradiation an underlayer coating used as an underlayer of a photoresist in a lithography process of the manufacture of semiconductor devices, includes a polymerizable compound containing 5 to 45% by mass of silicon atom (A), a photopolymerization initiator (B), and a solvent (C).

10 Claims, 1 Drawing Sheet

U.S. PATENT DOCUMENTS

| | | |
|---|---|---|
| 6,316,165 B1 | 11/2001 | Pavelchek et al. |
| 6,461,717 B1 | 10/2002 | Rutter, Jr. et al. |
| 6,576,393 B1 | 6/2003 | Sugita et al. |
| 6,730,454 B2 | 5/2004 | Pfeiffer et al. |
| 6,734,258 B2 | 5/2004 | Iguchi et al. |
| 6,749,765 B2 | 6/2004 | Rutter, Jr. et al. |
| 6,855,466 B2 | 2/2005 | Pavelchek et al. |
| 7,163,778 B2 | 1/2007 | Hatakeyama et al. |
| 7,172,849 B2 | 2/2007 | Babich et al. |
| 2001/0050741 A1* | 12/2001 | Hokazono et al. ............ 349/137 |
| 2002/0022196 A1 | 2/2002 | Pavelchek et al. |
| 2002/0077426 A1 | 6/2002 | Iguchi et al. |
| 2002/0110665 A1 | 8/2002 | Rutter, Jr. et al. |
| 2003/0198877 A1 | 10/2003 | Pfeiffer et al. |
| 2004/0017994 A1* | 1/2004 | Kodama et al. ............... 385/141 |
| 2004/0029041 A1 | 2/2004 | Shih et al. |
| 2004/0191479 A1 | 9/2004 | Hatakeyama et al. |
| 2004/0247900 A1 | 12/2004 | Ogihara et al. |
| 2004/0253461 A1 | 12/2004 | Ogihara et al. |
| 2004/0259024 A1 | 12/2004 | Kim et al. |
| 2005/0042538 A1 | 2/2005 | Babich et al. |
| 2005/0074689 A1 | 4/2005 | Angelopoulos et al. |
| 2007/0105363 A1 | 5/2007 | Babich et al. |

FOREIGN PATENT DOCUMENTS

| | | |
|---|---|---|
| JP | A-01-117032 | 5/1989 |
| JP | A-2000-294504 | 10/2000 |
| JP | A-2000-356854 | 12/2000 |
| JP | A-2001-093824 | 4/2001 |
| JP | A-2002-047430 | 2/2002 |
| JP | A-2002-128847 | 5/2002 |
| JP | A-2002-190519 | 7/2002 |
| JP | A-2004-310019 | 11/2004 |
| JP | A-2005-015779 | 1/2005 |
| JP | A-2005-018054 | 1/2005 |
| JP | A-2005-070776 | 3/2005 |
| JP | A-2005-221534 | 8/2005 |
| JP | A-2005-523474 | 8/2005 |
| WO | WO 02/05035 A1 | 1/2002 |
| WO | WO 03/073164 A2 | 9/2003 |
| WO | WO 2006/115044 A1 | 11/2006 |

OTHER PUBLICATIONS

European Search Report issued in European Patent Application No. 06 83 3856.5 on Dec. 2, 2009.

* cited by examiner

SILICON-CONTAINING RESIST UNDERLAYER COATING FORMING COMPOSITION FOR FORMING PHOTO-CROSSLINKING CURED RESIST UNDERLAYER COATING

TECHNICAL FIELD

The present invention relates to a composition for forming an underlayer coating between a semiconductor substrate and a photoresist. Specifically, the present invention relates to an underlayer coating forming composition for forming by light irradiation an underlayer coating used as an underlayer of a photoresist in a lithography process of the manufacture of semiconductor devices, and also relates to a method for forming an underlayer coating by use of the underlayer coating forming composition and a method for forming a photoresist pattern.

BACKGROUND ART

Conventionally, in the manufacture of semiconductor devices, micro-processing by lithography using a photoresist has been carried out. A method of the micro-processing is a processing method including forming a thin coating of a photoresist on a semiconductor substrate such as a silicon wafer or the like, irradiating actinic rays such as ultraviolet rays through a mask pattern on which a pattern for a semiconductor device is depicted, developing it to obtain a photoresist pattern, and etching the substrate using the photoresist pattern as a protective coating, thereby forming fine unevenness corresponding to the pattern on the surface of the substrate.

In recent progress in high integration of semiconductor devices, there has been a tendency that shorter wavelength actinic rays are being used, i.e., ArF excimer laser (193 nm) has been taking the place of KrF excimer laser (248 nm). Along with this change, influences of random reflection and standing wave of actinic rays from a substrate have become serious problems. Accordingly, it has been widely studied to provide an anti-reflective coating between the photoresist and the substrate (bottom anti-reflective coating) in order to resolve the problem. As the anti-reflective coating, from a viewpoint of easy use or the like, many considerations have been done on organic anti-reflective coatings (see, for example Patent Document 1).

Further, in recent years, in order to solve interconnection delay that has become clear with miniaturization in pattern rule of semiconductor devices, it has been considered to use copper as interconnect material, and to apply dual damascene process as interconnect forming method on the semiconductor substrate. And, in dual damascene process, via holes are formed and an anti-reflective coating is formed on a substrate having a high aspect ratio (height/diameter). Therefore, the anti-reflective coating for use in this process is required to have filling property by which the holes can be filled without gap, flattening property by which a flat coating can be formed on the surface of a substrate, and the like. However, it is difficult to apply organic material for anti-reflective coating on a substrate having a high aspect ratio, and in recent years, materials with particular emphasis on filling property or flattening property has been developed (see, for example Patent Documents 2, 3, 4 and 5).

In addition, in the production of devices such as semiconductor devices, in order to reduce poisoning effect of a photoresist layer induced by a dielectric layer, there is disclosed a method in which a barrier layer formed from a composition containing a crosslinkable polymer and the like is provided between the dielectric layer and the photoresist layer (see, for example Patent Document 6).

As mentioned above, in the recent manufacture of semiconductor devices, in order to attain several effects represented by anti-reflective effect, it comes to provide an organic underlayer coating formed from a composition containing an organic compound between a semiconductor substrate and a photoresist layer, namely, as an underlayer of the photoresist.

On the other hand, the above-mentioned organic underlayer coating is formed by applying an underlayer coating forming composition on a semiconductor substrate, and then heating the semiconductor substrate at a high temperature of about 170° C. to 200° C. Therefore, components with a low molecular weight contained in the underlayer coating forming composition are volatilized or sublimated on heating at the high temperature, and this causes problems that the volatilized or sublimated components adhere on peripheral apparatuses and thus the apparatuses are polluted. Further, it becomes problems that the components adhered to the apparatuses fall on the semiconductor substrate and it exerts a harmful influence on patter formation.

[Patent Document 1]
U.S. Pat. No. 5,919,599
[Patent Document 2]
Japanese Patent Application Publication No. JP-A-2000-294504
[Patent Document 3]
Japanese Patent Application Publication No. JP-A-2002-47430
[Patent Document 4]
Japanese Patent Application Publication No. JP-A-2002-190519
[Patent Document 5]
WO 02/05035 pamphlet
[Patent Document 6]
Japanese Patent Application Publication No. JP-A-2002-128847

DISCLOSURE OF THE INVENTION

Problems to be Solved by the Invention

An object of the present invention is to provide a silicon atom containing underlayer coating forming composition for curing and forming by light irradiation an underlayer coating used as an underlayer of a photoresist in a lithography process of the manufacture of semiconductor devices. Another object of the present invention is to provide a method for forming an underlayer coating used as an underlayer of a photoresist in a lithography process of the manufacture of semiconductor devices by use of the composition, and a method for forming a photoresist pattern. By containing 5-45% by mass of silicon atom, which is inorganic atom, as plasma-etching rate becomes slower when using oxygen gas, a hard mask layer having etching resistance is obtained.

That is, under a fluorine-containing gas (for example, $CF_4$) atmosphere condition, as underlayer coating of the present invention has high etching rate compared with a photoresist, when a fluorine-containing gas (for example, $CF_4$) is used for etching the underlayer coating of the present invention according to a photoresist pattern, a substrate can be processed by using a resist coating and an underlayer coating as protection coatings.

In addition, under a fluorine-containing gas (for example, $CF_4$) atmosphere condition, as the underlayer coating of the present invention has high etching rate compared with photoresist, the underlayer coating of the present invention can be removed by etching in accordance with the photoresist pattern, so that the photoresist pattern can be transferred to the underlayer coating of the present invention. Further, when an organic coating is further formed under the underlayer coating of the present invention, as the underlayer coating of the present invention has drastically low etching rate compared with the organic coating, which has a similar etching property to a photoresist, under $O_2$ (oxygen) gas atmosphere condition used at etching an organic coating, the resist pattern transferred to the underlayer coating, which acts as a hard mask, of the present invention can further be transferred to an organic coating and a semiconductor substrate can be processed with the organic coating as a protection coating.

An object of the present invention is to provide an underlayer coating that causes no intermixing with a photoresist applied and formed on an upper layer and that has a high dry etching rate compared with the photoresist under fluorine-containing gas atmosphere condition, and an underlayer coating forming composition for forming the underlayer coating.

Further, an object of the present invention is to provide an underlayer coating forming composition for forming an underlayer coating formed by light irradiation that can be used for an underlayer anti-reflective coating for reducing reflection of exposure irradiation light from a semiconductor substrate to a photoresist coating formed on the substrate in a lithography process of the manufacture of semiconductor devices, a flattening coating for flattening a semiconductor substrate having unevenness, a coating for preventing contamination of a photoresist due to substances generated from a semiconductor substrate on baking under heating, and the like.

Still further, an object of the present invention is to provide an inorganic anti-reflection coating forming composition containing a light-absorbing compound for suppressing reflection and scattering from a semiconductor substrate.

Means for Solving the Problem

The present invention relates to the following aspects:

as a first aspect, an underlayer coating forming composition for forming by light irradiation an underlayer coating used as an underlayer of a photoresist in a lithography process of a manufacture of a semiconductor device, includes a polymerizable compound containing 5 to 45% by mass of silicon atom (A), a photopolymerization initiator (B) and a solvent (C);

as a second aspect, in the underlayer coating forming composition according to the first aspect, the polymerizable compound (A) is a polymerizable compound having at least one cationic polymerizable reactive group, and the photopolymerization initiator (B) is a photo-cationic polymerization initiator;

as a third aspect, in the underlayer coating forming composition according to the second aspect, the cationic polymerizable reactive group is an epoxy group;

as a fourth aspect, in the underlayer coating forming composition according to the first aspect, the polymerizable compound (A) is a polymerizable compound having at least one radical polymerizable ethylenically unsaturated bond, and the photopolymerization initiator (B) is a photo-radical polymerization initiator;

as a fifth aspect, in the underlayer coating forming composition according to the fourth aspect, the ethylenically unsaturated bond is a vinyl group;

as a sixth aspect, in the underlayer coating forming composition according to any one of the first to fifth aspects, the polymerizable compound (A) containing silicon atom is at least one polymerizable compound (A1) containing silicon atom selected from a group consisting of an organosilicon compound represented by formula (I):

(in formula (I), $R^1$ is an epoxy group, a vinyl group or a polymerizable organic group having these groups and these groups are bonded to silicon atom through a Si—C bond; $R^3$ is an alkyl group, an aryl group, a halogenated alkyl group, a halogenated aryl group, or an organic group having a mercapto group, an amino group or a cyano group and these groups are bonded to silicon atom through a Si—C bond; $R^2$ is halogen atom, or an alkoxy group, an alkoxyalkyl group or an alkoxyacyl group having 1 to 8 carbon atom(s), a is an integer of 1, b is an integer of 0, 1 or 2, and a+b is an integer of 1, 2 or 3), and/or formula (II):

(in formula (II), $R^4$ is an epoxy group, a vinyl group or a polymerizable organic group having these groups and these groups are bonded to silicon atom through a Si—C bond; $R^5$ is an alkyl group, an aryl group, a halogenated alkyl group, a halogenated aryl group, or an organic group having a mercapto group, an amino group or a cyano group and these groups are bonded to silicon atom through a Si—C bond; Y is oxygen atom, a methylene group or an alkylene group having 2 to 20 carbon atoms and c is an integer of 1 or 2), a hydrolyzed compound thereof and a condensate thereof;

as a seventh aspect, in the underlayer coating forming composition according to any one of the first to fifth aspects, the polymerizable compound (A) containing silicon atom is a combination of at least one polymerizable compound (A1) containing silicon atom selected from a group consisting of an organosilicon compound represented by the formula (I) and/or (II), a hydrolyzed compound thereof and a condensate thereof and at least one polymerizable compound (A2) containing silicon atom selected from a group consisting of an organosilicon compound represented by formula (III):

(in formula (III), each of $R^1$ and $R^3$ is an alkyl group, an aryl group, a halogenated alkyl group, a halogenated aryl group, or an organic group having a mercapto group, an amino group or a cyano group and these groups are bonded to silicon atom through a Si—C bond; $R^2$ is halogen atom, or an alkoxy group, an alkoxyalkyl group or an alkoxyacyl group having 1 to 8 carbon atom(s), a and b are integers of 0, 1 or 2, and a+b is an integer of 0, 1 or 2), and/or formula (IV):

(in formula (IV), $R^4$ is an alkyl group having 1 to 5 carbon atom(s); X is an alkoxy group, an alkoxyalkyl group or an alkoxyacyl group having 1 to 4 carbon atom(s); Y is a methylene group or an alkylene group having 2 to 20 carbon atoms and c is an integer of 1 or 2), a hydrolyzed compound thereof and a condensate thereof;

as an eighth aspect, in the underlayer coating forming composition according to the sixth aspect or the seventh aspects, the polymerizable compound (A) containing silicon atom includes the compound (A1) or a combination of the compound (A1) and the compound (A2), and is a condensate having a polymerizable organic group of a weight average molecular weight of 100 to 100,000, and being prepared by hydrolyzing an organosilicon compound in a molar ratio of (A1):(A2) from 100:0 to 100:50 and condensing the hydrolyzed organosilicon compound;

as a ninth aspect, in the underlayer coating forming composition according to the sixth aspect or the seventh aspect, the polymerizable compound (A) containing silicon atom is a condensate having a polymerizable organic group of a weight average molecular weight of 100 to 1,000,000 and prepared by hydrolyzing an organosilicon compound containing 5-75% by mass of an organosilicon compound selected from organosilicon compounds represented by the formula (I) or a combination of the formula (I) and the formula (III) having a value of a+b of 1, and condensing the hydrolyzed organosilicon compound;

as a tenth aspect, the underlayer coating forming composition according to any one of the first to ninth aspects further includes a polymer compound containing a light absorption group having light absorption at a wavelength of 173 nm, 193 nm, 248 nm or 365 nm;

as an eleventh aspect, a method for manufacturing a semiconductor device includes: applying the underlayer coating forming composition according to any one of the first to tenth aspects on a semiconductor substrate to form an applied coating; and irradiating the applied coating with light to form an underlayer coating;

as a twelfth aspect, a method for manufacturing a semiconductor device includes: applying the underlayer coating forming composition according to any one of the first to tenth aspects on a semiconductor substrate to form an applied coating and irradiating the applied coating with light to form an underlayer coating; applying a photoresist composition on the underlayer coating to form a photoresist coating; exposing the photoresist coating to light; developing the photoresist after exposure to light to obtain a resist pattern; etching the underlayer coating according to the resist pattern; and processing the semiconductor substrate according to a patterned photoresist coating and a patterned underlayer coating;

as a thirteenth aspect, a method for manufacturing a semiconductor device includes: forming an organic coating using an application type organic coating forming composition on a semiconductor substrate; applying the underlayer coating forming composition according to any one of the first to tenth aspects on the organic coating to form an applied coating and irradiating the applied coating with light to form an underlayer coating; applying a photoresist composition on the underlayer coating to form a photoresist coating; exposing the photoresist coating to light; developing the photoresist after exposure to light to obtain a resist pattern; etching the underlayer coating according to the resist pattern; etching the organic coating according to the patterned underlayer coating; and processing the semiconductor substrate according to the patterned organic coating; and as a fourteenth aspect, in the method for manufacturing a semiconductor device according to any one of the eleventh to thirteenth aspects, the semiconductor substrate is a semiconductor substrate having a hole of an aspect ratio shown in height/diameter of 1 or more.

Effect of the Invention

The underlayer coating forming composition of the present invention can form by light irradiation an excellent underlayer coating that has a high dry etching rate compared with photoresists, and cause no intermixing with photoresists.

In addition, the underlayer coating forming composition of the present invention can form an underlayer coating by light irradiation without heating at a high temperature. Therefore, the pollution of the peripheral apparatuses due to the volatilization or sublimation of components with a low molecular weight can be prevented. Further, as no heating at a high temperature is required, the present invention has no concern for sublimation or the like even when it uses components with a low molecular weight for underlayer coating forming compositions, and it can use components with a low molecular weight in a relatively high content for underlayer coating forming compositions. Thus, an underlayer coating can be formed by using an underlayer coating forming composition having a relatively low viscosity. As a result, an underlayer coating excellent in filling property of holes and flattening property of semiconductor substrates can be formed.

BEST MODES FOR CARRYING OUT THE INVENTION

An underlayer coating forming composition of the present invention is a composition for forming by light irradiation an underlayer coating used as an underlayer of a photoresist in a lithographic process in the manufacture of semiconductor devices, and is an underlayer coating forming composition containing a polymerizable compound (A) containing 5 to 45% by mass of silicon atom, a photo polymerization initiator (B) and a solvent (C).

The polymerizable compound (A) is an organosilicon compound containing polymerizable organic group, a hydrolyzed compound of the organosilicon compound containing a polymerizable organic group, a condensate of the hydrolyzed compound of the organosilicon compound containing polymerizable organic group and a mixture thereof.

The above-mentioned polymerizable compound (A) is a polymerizable compound having at least one cation-polymerizable reactive group and a photo-cation polymerization initiator can be used as a photo polymerization initiator (B). The photo-cation polymerization initiator is activated by irradiating light to an underlayer coating containing the polymerizable compound (A), and cation polymerization of the polymerizable compound (A) proceeds to form an underlayer coating thereby. Preferably, the above-mentioned cation-polymerizable reactive group is an epoxy group. When the polymerizable compound (A) is a condensate, existence of two or more epoxy group, which is a polymerizable section, in a condensate is preferable with the object of improvement of solvent dissolution resistance to a solvent in an overcoated photoresist.

In addition, the above-mentioned polymerizable compound (A) is a polymerizable compound having at least one radical-polymerizable ethylenically unsaturated bond and a photo-radical polymerization initiator can be used as a photo polymerization initiator. The photo-radical polymerization initiator is activated by irradiating light to an underlayer coating containing the polymerizable compound (A), and radical polymerization of the polymerizable compound (A) proceeds to form an underlayer coating thereby. Preferably, the above-mentioned ethylenically unsaturated bond is vinyl group. As vinyl group, an organic group containing acryloxy group or methacryloxy group is preferable. When the polymerizable compound (A) is a condensate, existence of two or more vinyl group, which is a polymerizable section, in a condensate is preferable with the object of improvement of solvent dissolution resistance to a solvent in an overcoated photoresist.

In the present invention, as the polymerizable compound (A) containing silicon atom, at least one polymerizable compound (A1) containing silicon atom selected from a group consisting of an organosilicon compound represented by formula (I):

$$(R^1)_a(R^3)_b Si(R^2)_{4-(a+b)} \tag{I}$$

(in formula (I), $R^1$ is epoxy group, vinyl group or a polymerizable organic group having these groups and these groups are bonded to silicon atom through a Si—C bond; $R^3$ is alkyl group, aryl group, halogenated alkyl group, halogenated aryl group, or an organic group having mercapto group, amino group or cyano group and these groups are bonded to silicon atom through a Si—C bond; $R^2$ is halogen atom, or alkoxy group, alkoxyalkyl group or alkoxyacyl group having 1 to 8 carbon atom(s), a is an integer of 1, b is an integer of 0, 1 or 2, and a+b is an integer of 1, 2 or 3), and/or formula (II):

$$((R^4)_cSi(R^5)_{3-c})_2Y \qquad (II)$$

(in formula (II), $R^4$ is epoxy group, vinyl group or a polymerizable organic group having these groups and these groups are bonded to silicon atom through a Si—C bond; $R^5$ is alkyl group, aryl group, halogenated alkyl group, halogenated aryl group, or an organic group having mercapto group, amino group or cyano group and these groups are bonded to silicon atom through a Si—C bond; Y is oxygen atom, methylene group or alkylene group having 2 to 20 carbon atoms and c is an integer of 1 or 2), a hydrolyzed compound thereof and a condensate thereof, can be used.

The organosilicon compound represented in the formula (I) corresponding to the polymerizable compound (A1) preferably includes for example, vinyl group containing silane compounds such as methacrylamide trimethoxy silane, 2-methacryloxyethyl trimethoxy silane, (methacryloxymethyl)bis(trimethyloxy)methyl silane, methacryloxymethyl triethoxy silane, methacryloxymethyl trimethoxy silane, 3-methacryloxypropyl dimethyl chloro silane, 2-methacryloxyethyl trimethoxy silane, 3-methacryloxypropyl dimethyl ethoxy silane, 3-methacryloxypropyl dimethyl methoxy silane, 3-methacryloxypropyl trichloro silane, 3-methacryloxypropyl methyl diethoxy silane, 3-methacryloxypropyl methyl dimethoxy silane, 3-methacryloxypropyl tripropoxy silane, 3-methacryloxypropyl trichloro silane, 3-methacryloxypropyl triethoxy silane, 3-methacryloxypropyl trimethoxy silane, 2-methacryloxypropyl trimethoxy silane, 3-methacryloxypropyl tris(methoxyethyl) silane, methacryloxy trimethoxy silane, methacryloxy tributoxy silane, methacryloxy triisopropoxy silane, methacryloxy triphenoxy silane, methacryloxy phenyl dimethoxy silane, methacryloxy phenyl methyl methoxy silane, methacryloxy phenyl dichloro silane, methacryloxy phenyl dimethyl silane, methacryloxy phenyl diethoxy silane, methacryloxy phenyl dichloro silane, methacryloxy trimethoxy silane, methacryloxy methyl dimethoxy silane, methacryloxy methyl diethoxy silane, methacryloxy methyl diacetoxy silane, methacryloxy diphenyl chloro silane, acrylamide trimethoxy silane, 2-acryloxyethyl trimethoxy silane, (acryloxymethyl)bis(trimethyloxy) methyl silane, acryloxymethyl triethoxy silane, acryloxymethyl trimethoxy silane, 3-acryloxypropyl dimethyl chloro silane, 2-acryloxyethyl trimethoxy silane, 3-acryloxypropyl dimethyl ethoxy silane, 3-acryloxypropyl dimethyl methoxy silane, 3-acryloxypropyl trichloro silane, 3-acryloxypropyl methyl diethoxy silane, 3-acryloxypropyl methyl dimethoxy silane, 3-acryloxypropyl tripropoxy silane, 3-acryloxypropyl trichloro silane, 3-acryloxypropyl triethoxy silane, 3-acryloxypropyl trimethoxy silane, 2-acryloxypropyl trimethoxy silane, 3-acryloxypropyl tris(methoxyethyl) silane, acryloxy trimethoxy silane, acryloxy tributoxy silane, acryloxy triisopropoxy silane, acryloxy triphenoxy silane, acryloxy phenyl dimethoxy silane, acryloxy phenyl methyl methoxy silane, acryloxy phenyl dichloro silane, acryloxy phenyl dimethyl silane, acryloxy phenyl diethoxy silane, acryloxy phenyl dichloro silane, acryloxy trimethoxy silane, acryloxy methyl dimethoxy silane, acryloxy methyl diethoxy silane, acryloxy methyl diacetoxy silane, and acryloxy diphenyl chloro silane, and epoxy group containing silane compounds such as glycidoxymethyl trimethoxy silane, glycidoxymethyl triethoxy silane, α-glycidoxyethyl trimethoxy silane, α-glycidoxyethyl triethoxy silane, β-glycidoxyethyl trimethoxy silane, β-glycidoxyethyl triethoxy silane, α-glycidoxypropyl trimethoxy silane, α-glycidoxypropyl triethoxy silane, β-glycidoxypropyl trimethoxy silane, β-glycidoxypropyl triethoxy silane, γ-glycidoxypropyl trimethoxy silane, γ-glycidoxypropyl triethoxy silane, γ-glycidoxypropyl tripropoxy silane, γ-glycidoxypropyl tributoxy silane, γ-glycidoxypropyl triphenoxy silane, α-glycidoxybutyl trimethoxy silane, α-glycidoxybutyl triethoxy silane, β-glycidoxybutyl triethoxy silane, γ-glycidoxybutyl trimethoxy silane, γ-glycidoxybutyl triethoxy silane, δ-glycidoxybutyl trimethoxy silane, δ-glycidoxybutyl triethoxy silane, (3,4-epoxycyclohexyl)methyl trimethoxy silane, (3,4-epoxycyclohexyl)methyl triethoxy silane, β-(3,4-epoxycyclohexyl)ethyl trimethoxy silane, β-(3,4-epoxycyclohexyl)ethyl triethoxy silane, β-(3,4-epoxycyclohexyl)ethyl tripropoxy silane, β-(3,4-epoxycyclohexyl)ethyl tributoxy silane, β-(3,4-epoxycyclohexyl)ethyl triphenoxy silane, γ-(3,4-epoxycyclohexyl)propyl trimethoxy silane, γ-(3,4-epoxycyclohexyl)propyl triethoxy silane, δ-(3,4-epoxycyclohexyl)butyl trimethoxy silane, δ-(3,4-epoxycyclohexyl)butyl triethoxy silane, glycidoxymethyl methyl dimethoxy silane, glycidoxymethyl methyl diethoxy silane, α-glycidoxyethyl methyl dimethoxy silane, α-glycidoxyethyl methyl diethoxy silane, β-glycidoxyethyl methyl dimethoxy silane, β-glycidoxyethyl ethyl dimethoxy silane, α-glycidoxypropyl methyl dimethoxy silane, α-glycidoxypropyl methyl diethoxy silane, β-glycidoxypropyl methyl dimethoxy silane, β-glycidoxypropyl ethyl dimethoxy silane, γ-glycidoxypropyl methyl dimethoxy silane, γ-glycidoxypropyl methyl diethoxy silane, γ-glycidoxypropyl methyl dipropoxy silane, γ-glycidoxypropyl methyl dibutoxy silane, γ-glycidoxypropyl methyl diphenoxy silane, γ-glycidoxypropyl ethyl dimethoxy silane, γ-glycidoxypropyl ethyl diethoxy silane, γ-glycidoxypropyl vinyl dimethoxy silane, γ-glycidoxypropyl vinyl diethoxy silane.

Organosilicon compounds represented in the formula (II) corresponding to the polymerizable compound (A1) preferably include for example, epoxy group containing silane compounds such as bis(2-(3,4-epoxycyclohexyl)ethyl) tetramethyl disiloxane, di(glycidoxypropyl) tetramethyl disiloxane, di(glycidoxypropyl) tetraphenyl disiloxane, and vinyl group containing silane compounds such as di(3-methacryloxypropyl) tetramethyl disiloxane, di(3-methacryloxypropyl) tetraphenyl disiloxane, di(3-acryloxypropyl) tetramethyl disiloxane, di(3-acryloxypropyl) tetraphenyl disiloxane.

The polymerizable compound (A1) is at least one polymerizable compound (A1) containing silicon atom selected from a group consisting of an organosilicon compound represented by the formula (I) and/or the formula (II), a hydrolyzed compound of the each organosilicon compound and a condensate made of the hydrolyzed compound of the each organosilicon compound.

In the present invention, in order to improve etching resistance, anti-reflection property, storage stability, wettability with a substrate and the like, the polymerizable compound (A2) having no organic polymerizable group such as epoxy group and vinyl group, and having silicon atoms may be combined with the polymerizable compound (A1).

The polymerizable compound (A2) having silicon atom is at least one compound containing silicon atom selected from a group consisting of an organosilicon compound represented by formula (III):

$$(R^1)_a(R^3)_b Si(R^2)_{4-(a+b)} \quad (III)$$

(in formula (III), each of $R^1$ or $R^3$ is alkyl group, aryl group, halogenated alkyl group, halogenated aryl group, or an organic group having mercapto group, amino group or cyano group and these groups are bonded to silicon atom through a Si—C bond; $R^2$ is halogen atom, or alkoxy group, alkoxyalkyl group or alkoxyacyl group having 1 to 8 carbon atom(s), a and b are integers of 0, 1 or 2, and a+b is an integer of 0, 1 or 2), and/or formula (IV):

$$((R^4)_c Si(X)_{3-c})_2 Y \quad (IV)$$

(in formula (IV), $R^4$ is alkyl group having 1 to 5 carbon atom(s); X is alkoxy group, alkoxyalkyl group or alkoxyacyl group having 1 to 4 carbon atom(s); Y is methylene group or alkylene group having 2 to 20 carbon atoms and c is an integer of 0 or 1), a hydrolyzed compound thereof and a condensate thereof.

Organosilicon compounds represented in the formula (III) corresponding to the polymerizable compound (A2) preferably include for example, tetramethoxy silane, tetraethoxy silane, tetra-n-propoxy silane, tetra-isopropoxy silane, tetra-n-butoxy silane, tetraacetoxy silane, methyl trimethoxy silane, methyl tripropoxy silane, methyl triacetoxy silane, methyl tributoxy silane, methyl tripropoxy silane, methyl triamyloxy silane, methyl triphenoxy silane, methyl tribenzyloxy silane, methyl triphenethyloxy silane, ethyl trimethoxy silane, ethyl triethoxy silane, phenyl trimethoxy silane, phenyl triethoxy silane, phenyl triacetoxy silane, γ-chloropropyl trimethoxy silane, γ-chloropropyl triethoxy silane, γ-chloropropyl triacetoxy silane, 3,3,3-trifloropropyl trimethoxy silane, γ-mercaptopropyl trimethoxy silane, γ-mercaptopropyl triethoxy silane, β-cyanoethyl triethoxy silane, chloromethyl trimethoxy silane, chloroethyl triethoxy silane, N-(β-aminoethyl)-γ-aminopropyl trimethoxy silane, N-(β-aminoethyl)-γ-aminopropyl methyl dimethoxy silane, γ-aminopropyl methyl dimethoxy silane, N-(β-aminoethyl)-γ-aminopropyl triethoxy silane, N-(β-aminoethyl)-γ-aminopropyl methyl diethoxy silane, dimethyl dimethoxy silane, phenyl methyl dimethoxy silane, dimethyl diethoxy silane, phenyl methyl diethoxy silane, γ-chloropropyl methyl dimethoxy silane, γ-chloropropyl methyl diethoxy silane, dimethyl diacetoxy silane, γ-methacryloxypropyl methyl dimethoxy silane, γ-methacryloxypropyl methyl diethoxy silane, γ-mercaptopropyl methyl dimethoxy silane, γ-mercapto methyl diethoxy silane, methyl vinyl dimethoxy silane; methyl vinyl diethoxy silane.

Organosilicon compounds represented in the formula (IV) corresponding to the polymerizable compound (A2) preferably include for example, methylene bismethyldimethoxysilane, ethylene bisethyldimethoxysilane, propylene bisethyldiethoxysilane, butylene bismethyldiethoxysilane.

The polymerizable compound (A2) is at least one polymerizable compound (A2) containing silicon atom selected from a group consisting of an organosilicon compound represented by the formula (III) and the formula (IV), a hydrolyzed compound of each organosilicon compound and an condensate made of the hydrolyzed compound of each organosilicon compound.

In the present invention, the above-mentioned polymerizable compound (A) containing silicon atom includes the compound (A1) or the combination of the compound (A1) and (A2). A condensate having polymerizable organic groups of a weight average molecular weight of 100 to 100,000 and being prepared by hydrolyzing organosilicon compounds in a molar ratio of (A1):(A2) from 100:0 to 100:50 and condensing the hydrolyzed organosilicon compound is preferable.

When the above-mentioned organosilicon compound is hydrolyzed and condensed, more than 1 mol and not more than 100 mol, preferably 1-50 mol of water is used based on 1 mole of hydrolyzable group (for example, chlorine atom and alkoxy group) of the organosilicon compound.

When producing a polymerizable compound (A) of the present invention, it is characteristic that at least one silane compound selected from the above mentioned compounds is hydrolyzed and condensed by using a catalyst. Catalysts which can be used in this reaction include metal chelate compounds such as titanium or aluminum, acid catalysts and alkali catalysts.

Preferably, the polymerizable compound (A) containing silicon atom is a condensate having a polymerizable organic group of a weight average molecular weight of 100 to 1,000,000 and prepared by hydrolyzing an organosilicon compound containing 5-75% by mass of organosilicon selected from organosilicon compounds represented by the formula (I) or a combination of the formula (I) and the formula (III) having a value of (a+b) of 1, and condensing the hydrolyzed organosilicon compound.

Usually, the underlayer coating forming composition of the present invention is prepared by dissolving or dispersing the polymerizable compound (A) in an organic solvent. These organic solvents include at least one solvent selected from a group consisting of alcohol type solvents, ketone type solvents, amide type solvents, ester type solvents and aprotic solvents.

The underlayer coating forming composition of the present invention may further add components such as β-diketones, colloidal silicas, colloidal aluminas, organic polymers, surfactants, silane coupling agents, radical initiators, triazene compounds, alkali compounds.

The organosilicon compound used in the present invention is usually hydrolyzed in an organic solvent and condensed.

Organic solvents used for hydrolysis include for example, aliphatic hydrocarbon type solvents such as n-pentane, i-pentane, n-hexane, i-hexane, n-heptane, i-heptane, 2,2,4-trimethylpentane, n-octane, i-octane, cyclohexane, methylcyclohexane, aromatic hydrocarbon type solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, trimethylbenzene, monoalcoholic solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethyl hexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethyl cyclohexanol, benzyl alcohol, phenylmethylcarbinol, diacetone alcohol, cresol, polyvalent alcoholic solvents such as ethylene glycol, propylene glycol, 1,3-butylene glycol, pentanediol-2,4,2-methylpentanediol-2,4, hexanediol-2,5, heptanediol-2,4,2-ethyl hexanediol-1,3, diethyleneglycol, dipropyleneglycol, triethyleneglycol, tripropyleneglycol, glycerin, ketone type solvents such as acetone, methylethyl ketone, methyl-n-propyl ketone, methyl-n-butyl ketone, diethyl ketone, methyl-1-butyl ketone, methyl-n-pentyl ketone, ethyl-n-butyl ketone, methyl-n-hexyl ketone, di-1-butyl ketone, trimethylnonanone, cyclohexanone, methylcyclohexanone, 2,4,-pentanedione, acetonylacetone, diacetone alcohol, acetophenone, fenchone, ether type solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofurane, 2-methyltetrahydrofurane, ester type solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, nitrogen containing solvents such as N-methylformamide, N,N-dimethylformamide, N,N-diethylformamide, acetamide, N-methylacetamide, N,N-dimethylacetamide, N-methylpropionamide, N-methylpyrrolidone, sulfur containing solvents such as dimethyl sulfide, diethyl sulfide, thiophene, tetrahydrothiophene, dimethyl sulfoxide, sulfolane, 1,3-propanesultone.

Particularly, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate and propylene glycol monopropyl ether acetate are preferable in storage stability of the solution.

Further, when organosilicon compounds are hydrolyzed and condensed, catalysts may also be used. Catalysts used in this reaction include metal chelate compounds, organic acids, inorganic acids, organic bases, inorganic bases. Metal chelate compounds include for example, titanium chelate compounds such as triethoxy-mono(acetylacetonato)titanium, tri-n-propoxy.mono(acetylacetonato)titanium, tri-i-propoxy.mono(acetylacetonato)titanium, tri-n-butoxy.mono(acetylacetonato)titanium, tri-sec-butoxy.mono(acetylacetonato)titanium, tri-t-butoxy.mono(acetylacetonato)titanium, diethoxy.bis(acetylacetonato)titanium, di-n-propoxy.bis(acetylacetonato)titanium, di-i-propoxy.bis(acetylacetonato)titanium, di-n-butoxy.bis(acetylacetonato)titanium, di-sec-butoxy.bis(acetylacetonato)titanium, di-t-butoxy.bis(acetylacetonato)titanium, monoethoxy.tris(acetylacetonato)titanium, mono-n-propoxy.tris(acetylacetonato)titanium, mono-i-propoxy.tris(acetylacetonato)titanium, mono-n-butoxy.tris(acetylacetonato)titanium, mono-sec-butoxy.tris(acetylacetonato)titanium, mono-t-butoxy.tris(acetylacetonato)titanium, tetrakis(acetylacetonato)titanium, triethoxy.mono(ethyl acetoacetato)titanium, tri-n-propoxy.mono(ethyl acetoacetato)titanium, tri-i-propoxy.mono(ethyl acetoacetato)titanium, tri-n-butoxy.mono(ethyl acetoacetato)titanium, tri-sec-butoxy.mono(ethyl acetoacetato)titanium, tri-t-butoxy.mono(ethyl acetoacetato)titanium, diethoxy.bis(ethyl acetoacetato)titanium, di-n-propoxy.bis(ethyl acetoacetato)titanium, di-i-propoxy.bis(ethyl acetoacetato)titanium, di-n-butoxy.bis(ethyl acetoacetato)titanium, di-sec-butoxy.bis(ethyl acetoacetato)titanium, di-t-butoxy.bis(ethyl acetoacetato)titanium, monoethoxy.tris(ethyl acetoacetato)titanium, mono-n-propoxy.tris(ethyl acetoacetato)titanium, mono-i-propoxy.tris(ethyl acetoacetato)titanium, mono-n-butoxy.tris(ethyl acetoacetato)titanium, mono-sec-butoxy.tris(ethyl acetoacetato)titanium, mono-t-butoxy.tris(ethyl acetoacetato)titanium, tetrakis(ethyl acetoacetato)titanium, mono(acetylacetonato)tris(ethyl acetoacetato)titanium, bis(acethylacetonato)bis(ethyl acetoacetato)titanium, tris(acethylacetonato)mono(ethylacetoacetato)titanium, zirconium chelate compounds such as triethoxy.mono(acetylacetonato)zirconium, tri-n-propoxy.mono(acetylacetonato)zirconium, tri-i-propoxy.mono(acetylacetonato)zirconium, tri-n-butoxy.mono(acetylacetonato)zirconium, tri-sec-butoxy.mono(acetylacetonato)zirconium, tri-t-butoxy.mono(acetylacetonato)zirconium, diethoxy.bis(acetylacetonato)zirconium, di-n-propoxy.bis(acetylacetonato)zirconium, di-i-propoxy.bis(acetylacetonato)zirconium, di-n-butoxy.bis(acetylacetonato)zirconium, di-sec-butoxy.bis(acetylacetonato)zirconium, di-t-butoxy.bis(acetylacetonato)zirconium, monoethoxy.tris(acetylacetonato)zirconium, mono-n-propoxy.tris(acetylacetonato)zirconium, mono-i-propoxy.tris(acetylacetonato)zirconium, mono-n-butoxy.tris(acetylacetonato)zirconium, mono-sec-butoxy.tris(acetylacetonato)zirconium, mono-t-butoxy.tris(acetylacetonato)zirconium, tetrakis(acetylacetonato)zirconium, triethoxy.mono(ethyl acetoacetato)zirconium, tri-n-propoxy.mono(ethyl acetoacetato)zirconium, tri-i-propoxy.mono(ethyl acetoacetato)zirconium, tri-n-butoxy.mono(ethyl acetoacetato)zirconium, tri-sec-butoxy.mono(ethyl acetoacetato)zirconium, tri-t-butoxy.mono(ethylacetoacetato)zirconium, diethoxy.bis(ethyl acetoacetato)zirconium, di-n-propoxy.bis(ethyl acetoacetato)zirconium, di-i-propoxy.bis(ethyl acetoacetato)zirconium, di-n-butoxy.bis(ethyl acetoacetato)zirconium, di-sec-butoxy.bis(ethyl acetoacetato)zirconium, di-t-butoxy.bis(ethyl acetoacetato)zirconium, monoethoxy.tris(ethyl acetoacetato)zirconium, mono-n-propoxy.tris(ethyl acetoacetato)zirconium, mono-i-propoxy.tris(ethyl acetoacetato)zirconium, mono-n-butoxy.tris(ethyl acetoacetato)zirconium, mono-sec-butoxy.tris(ethyl acetoacetato)zirconium, mono-t-butoxy.tris(ethyl acetoacetato)zirconium, tetrakis(ethyl acetoacetato)zirconium, mono(acetylacetonato)tris(ethyl acetoacetato)zirconium, bis(acetylacetonato)bis(ethyl acetoacetato)zirconium, tris(acetylacetonato)mono(ethyl acetoacetato)zirconium, aluminum chelate compounds such as tris(acetylacetonato)aluminum, tris(ethyl acetoacetato) aluminum. Organic acids includes for example, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid. Inorganic acids include for example, hydrochloric acid, nitric acid, sulfuric acid, hydrofluoric acid, phosphoric acid. Organic bases include for example, pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide. Inorganic bases include for example, ammonia, sodium hydroxide, potassium hydroxide, barium hydroxide, calcium hydroxide. In these catalysts, metal chelate compounds, organic acids and inorganic acids are preferable, and titanium chelate compounds and organic acids can more preferably be mentioned. These compounds may be used solely or in combination of two or more kinds.

Further, for improving adhesiveness of resist, wettability to a substrate, flexibility, flatness and the like, the polymerizable compound containing no silicon atoms mentioned below can be used to be copolymerized (hybridized) or mixed with the above-mentioned polymerizable compound containing silicon atoms, if necessary.

Specific examples of the polymerizable compound containing no silicon atoms and having ethylenically unsaturated bond are ethylene glycol di(meth)acrylate, diethylene glycol di(meth)acrylate, triethylene glycol di(meth)acrylate, tetraethylene glycol di(meth)acrylate, nonaethylene glycol di(meth)acrylate, polyethylene glycol di(meth)acrylate, tripropylene glycol di(meth)acrylate, tetrapropylene glycol di(meth)acrylate, nonapropylene glycol di(meth)acrylate, polypropylene glycol di(meth)acrylate, 2,2-bis(4-(acryloxydiethoxy)phenyl)propane, 2,2-bis(4-(methacryloxydiethoxy)phenyl)propane, 3-phenoxy-2-propanoyl acrylate, 1,6-bis(3-acryloxy-2-hydroxypropyl)-hexyl ether, pentaerythritol tri(meth)acrylate, trimethyrol propane tri(meth)acrylate, glycerol tri(meth)acrylate, tris(2-hydroxylethyl)-isocyanuric acid ester (meth)acrylate, pentaerythritol tetra (meth)acrylate, dipentaerythritol penta(meta)acrylate, and dipentaerythritol hexa(meth)acrylate, etc. In the meantime, in the specification, for example, ethylene glycol di(meth)acrylate means ethylene glycol diacrylate and ethylene glycol dimethacrylate.

The polymerizable compound containing no silicon atoms and having ethylenically unsaturated bond also includes urethane compounds that can be obtained by reaction between a polyvalent isocyanate compound and a hydroxyalkyl unsaturated carboxylic acid ester compound, compounds that can be obtained by reaction between a polyvalent epoxy compound and a hydroxyalkyl unsaturated carboxylic acid ester compound, diallyl ester compounds such as diallyl phthalate, and divinyl compounds such as divinyl phthalate, and the like.

In addition, the polymerizable compound containing no silicon atoms and having cationic polymerizable moiety includes compounds having cyclic ether structure such as epoxy ring and oxetane ring, vinyl ether structure and vinyl thioether structure, and the like.

The polymerizable compound containing no silicon atoms and having epoxy ring is not specifically limited and compounds having 1 to 6, or 2 to 4 epoxy rings can be used. The polymerizable compounds having the epoxy ring include compounds having 2 or more glycidyl ether structures or glycidyl ester structures that can be produced from a compound having 2 or more hydroxy groups or carboxy groups, such as a diol compound, a triol compound, a dicarboxylic acid compound and a tricarboxylic acid compound, and a glycidyl compound such as epichlorohydrin.

Specific examples of the polymerizable compound containing no silicon atoms and having epoxy ring that can be mentioned are 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris(p-(2,3-epoxypropoxy)phenyl)propane, 1,2-cyclohexane dicarboxylic acid diglycidyl ester, 4,4'-methylenebis(N,N-diglycidylaniline), 3,4-epoxycyclohexylmethyl-3,4-epoxycyclohexane carboxylate, trimethylol ethane triglycidyl ether, triglycidyl-p-aminophenol, tetraglycidyl metaxylenediamine, tetraglycidyl diaminodiphenyl methane, tetraglycidyl-1,3-bisaminomethylcyclohexane, bisphenol-A-diglycidyl ether, bisphenol-S-diglycidyl ether, pentaerythritol tetraglycidyl ether, resorcinol diglycidyl ether, phthalic acid diglycidyl ester, neopentyl glycol diglycidyl ether, polypropylene glycol diglycidyl ether, tetrabromo bisphenol-A-diglycidyl ether, bisphenol hexafluoroacetone diglycidyl ether, pentaerythritol diglycidyl ether, tris-(2,3-epoxypropyl) isocyanurate, monoallyldiglycidyl isocyanurate, diglycerol polydiglycidyl ether, pentaerythritol polyglycidyl ether, 1,4-bis(2,3-epoxypropoxyperfluoroisopropyl)cyclohexane, sorbitol polyglycidyl ether, trimethyrolpropane polyglycidyl ether, resorcin diglycidyl ether, 1,6-hexanediol diglycidyl ether, polyethylene glycol diglycidyl ether, phenyl glycidyl ether, p-tert-butylphenyl glycidyl ether, adipic acid diglycidyl ether, o-phthalic acid diglycidyl ether, dibromophenyl glycidyl ether, 1,2,7,8-diepoxyoctane, 1,6-dimethyrolperfluorohexane diglycidyl ether, 4,4'-bis(2,3-epoxypropoxyperfluoroisopropyl)diphenyl ether, 2,2-bis(4-glycidyloxyphenyl) propane, 3,4-epoxycyclohexylmethyl-3',4'-epoxycyclohexane carboxylate, 3,4-epoxycyclohexyl oxirane, 2-(3,4-epoxycyclohexyl)-3',4'-epoxy-1,3-dioxane-5-spirocyclohexane, 1,2-ethylenedioxy-bis(3,4-epoxycyclohexylmethane), 4',5'-epoxy-2'-methylcyclohexylmethyl-4,5-epoxy-2-methylcyclohexane carboxylate, ethylene glycol-bis(3,4-epoxycyclohexanecarboxylate), bis-(3,4-epoxycyclohexylmethyl)adipate, and bis(2,3-epoxycyclopentyl)ether.

The polymerizable compound containing no silicon atoms and having oxetane ring is not specifically limited, and compounds having 1 to 6 or 2 to 4 oxetane rings can be used.

The polymerizable compound containing no silicon atoms and having oxetane ring includes for example, 3-ethyl-3-hydroxymethyl oxetane, 3-ethyl-3-(phenoxymethyl)oxetane, 3,3-diethyl oxetane, and 3-ethyl-3-(2-ethylhexyloxymethyl) oxetane, 1,4-bis(((3-ethyl-3-oxetanyl)methoxy)methyl)benzene, di((3-ethyl-3-oxetanyl)methyl)ether, and pentaerythritol tetrakis((3-ethyl-3-oxetanyl)methyl)ether.

The polymerizable compound containing no silicon atoms and having vinyl ether structure is not specifically limited, and compounds having 1 to 6 or 2 to 4 vinyl ether structures can be used.

The polymerizable compound containing no silicon atoms and having vinyl ether structure includes for example, vinyl-2-chloroethyl ether, vinyl-n-butyl ether, 1,4-cyclohexanedimethanol divinyl ether, vinylglycidyl ether, bis(4-(vinyloxymethyl)cyclohexylmethyl)glutarate, tri(ethyleneglycol) divinyl ether, adipic acid divinyl ester, diethylene glycol divinyl ether, tris(4-vinyloxy)butyl trimellilate, bis(4-vinyloxy)butyl)terephthalate, bis(4-vinyloxy)butylisophthalate, ethylene glycol divinyl ether, 1,4-butanediol divinyl ether, tetramethylene glycol divinyl ether, tetraethylene glycol divinyl ether, neopentyl glycol divinyl ether, trimethylol propane trivinyl ether, trimethylol ethane trivinyl ether, hexanediol divinyl ether, 1,4-cyclohexanediol divinyl ether, tetraethylene glycol divinyl ether, pentaerythritol divinyl ether, pentaerythritol trivinyl ether and cyclohexane dimethanol divinyl ether.

The photopolymerization initiator (B) in the underlayer coating forming composition of the present invention is not specifically limited so long as the initiator can initiate the polymerization of the polymerizable compound by light irradiation. Compounds that generate an acid (Bronsted acid or Lewis acid), a base, a radical or a cation by light irradiation can be used.

For example, compounds that can generate an active radical by light irradiation and cause radical polymerization of the polymerizable compound, namely, photo-radical polymerization initiators, and compounds that can generate a cation species such as a protonic acid and a carbocation by light irradiation and cause cation polymerization of the polymer compound, namely, photo-cationic polymerization initiators, and the like can be mentioned.

Light irradiation can be performed by use of light having a wavelength of 150 nm to 1,000 nm, or 200 nm to 700 nm, or 300 nm to 600 nm, for example. And, the following photopolymerization initiators are preferably used: the photo-radical polymerization initiator that generates an active radical, or the photo-cationic polymerization initiator that generates a cation species at an exposure value of 1 to 2,000 mJ/cm$^2$, or 10 to 1,500 mJ/cm$^2$, or 50 to 1,000 mJ/cm$^2$.

The photo-radical polymerization initiator includes for example, imidazole compounds, diazo compounds, bisimidazole compounds, N-arylglycine compounds, organic azide compounds, titanocene compounds, aluminate compounds, organic peroxides, N-alkoxypyridinium salt compounds, and thioxanthone compounds.

The azide compounds include p-azidebenzaldehyde, p-azideacetophenone, p-azidebenzoic acid, p-azidebenzalacetophenone, 4,4'-diazidechalcone, 4,4'-diazidediphenylsulfide, and 2,6-bis(4'-azidebenzal)-4-methylcyclohexanone, etc.

The diazo compounds include 1-diazo-2,5-diethoxy-4-p-tolylmercaptobenzene borofluoride, 1-diazo-4-N,N-dimethylaminobenzene chloride, and 1-diazo-4-N,N-diethylaminobenzene borofluoride, etc.

The bisimidazole compounds include 2,2'-bis(o-chlorophenyl)-4,5,4',5'-tetrakis(3,4,5-trimethoxyphenyl)1,2'-bisimidazole, and 2,2'-bis(o-chlorophenyl)-4,5,4',5'-tetraphenyl-1,2'-bisimidazole, etc.

The titanocene compounds include dicyclopentadienyl-titanium-dichloride, dicyclopentadienyl-titanium-bisphenyl, dicyclopentadienyl-titanium-bis(2,3,4,5,6-pentafluorophenyl), dicyclopentadienyl-titanium-bis(2,3,5,6-tetrafluorophenyl), dicyclopentadienyl-titanium-bis(2,4,6-trifluorophenyl), dicyclopentadienyl-titanium-bis(2,6-difluorophenyl), dicyclopentadienyl-titanium-bis(2,4-difluorophenyl), bis(methylcyclopentadienyl)-titanium-bis(2,3,4,5,6-pentafluorophenyl), bis(methylcyclopentadienyl)-titanium-bis(2,3,5,6-tetrafluorophenyl), bis(methylcyclopentadienyl)-titanium-bis(2,6-difluorophenyl), and dicyclopentadienyl-titanium-bis(2,6-difluoro-3-(1H-pyrrol-1-yl)-phenyl), etc.

The photo-radical polymerization initiator also includes 1,3-di(tert-butyldioxycarbonyl)benzophenone, 3,3',4,4'-tetrakis(tert-butyldioxycarbonyl)benzophenone, 3-phenyl-5-isooxazolone, 2-mercaptobenzimidazole, 2,2-dimethoxy-1,2-diphenylethane-1-one, 1-hydroxy-cyclohexyl-phenyl-ketone, and 2-benzyl-2-dimethylamino-1-(4-morpholinophenyl)-butane, etc.

The photo-cationic polymerization initiator includes sulfonic acid esters, sulfonimide compounds, disulfonyldiazomethane compounds, dialkyl-4-hydroxysulfonium salts, arylsulfonic acid-p-nitrobenzyl ester, silanol-aluminum complex, (η6-benzene)(η5-cyclopentadienyl)iron (II), etc.

The sulfonimide compounds include for example, N-(trifluoromethanesulfonyloxy)succinimide, N-(nonafluoro-n-butanesulfonyloxy)succinimide, N-(camphorsulfonyloxy)succinimide and N-(trifluoromethanesulfonyloxy)naphthalimide.

The disulfonyldiazomethane compounds include for example, bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photo-cationic polymerization initiator also includes 2-methyl-1-(4-methylthiophenyl)-2-morpholinopropane-1-one.

In addition, aromatic iodonium salt compounds, aromatic sulfonium salt compounds, aromatic diazonium salt compounds, aromatic phosphonium salt compounds, triazine compounds and iron arene complex compounds, etc. can be used as both the photo-radical polymerization initiator and the photo-cationic polymerization initiator.

The aromatic iodonium salt compounds include diphenyliodonium hexafluorophosphate, diphenyliodonium trifluoromethane sulfonate, diphenyliodonium nonafluoro-n-butane sulfonate, diphenyliodonium perfluoro-n-octane sulfonate, diphenyliodonium camphor sulfonate, bis(4-tert-butylphenyl)iodonium camphor sulfonate and bis(4-tert-butylphenyl)iodonium trifluoromethane sulfonate, etc.

The aromatic sulfonium salt compounds include for example, triphenylsulfonium hexafluoroantimonate, triphenylsulfonium nonafluoron-butanesulfonate, triphenylsulfonium camphor sulfonate and triphenylsulfonium trifluoromethane sulfonate.

In the underlayer coating forming composition of the present invention, the photopolymerization initiator can be used solely or in combination of two or more kinds.

The content of the polymerizable compound (A) and the photopolymerization initiator (B) in the underlayer coating forming composition of the present invention is as follows. The content of the photopolymerization initiator (B) is for example 1 to 20 mass % or 3 to 10 mass % based on 100 mass % of the polymerizable compound (A). When the content of the photopolymerization initiator (B) is less than the lower limit, the polymerization does not proceed sufficiently, the hardness and wear resistance of the obtained underlayer coating may become insufficient. When the content of the photopolymerization initiator is more than the upper limit, hardening occurs only at the vicinity of the surface of the underlayer coating, and thus it may become difficult to harden completely to the inside of the underlayer coating.

When the compound having ethylenically unsaturated bond being radical polymerizable moiety is used as the polymerizable compound (A) in the underlayer coating forming composition of the present invention, the photo-radical polymerization initiator is preferably used as the photopolymerization initiator (B). When the compound having vinyl ether structure, epoxy ring or oxetane ring being cationic polymerizable moiety is used as the polymerizable compound (A), the photo-cationic polymerization initiator is preferably used as the photopolymerization initiator (B).

The underlayer coating forming composition of the present invention can contain in addition to the above-mentioned polymerizable compound (A) and photopolymerization initiator (B), surfactants, sensitizers, amine compounds, polymer compounds, antioxidants, heat polymerization inhibitors, surface modifiers and defoamers, etc., if necessary.

The addition of the surfactants can lead to inhibition of occurrence of pinholes or striation, etc., and to improvement in the application property of the underlayer coating forming composition. The surfactants include for example, polyoxyethylene alkyl ether compounds such as polyoxyethylene lauryl ether, polyoxyethylene stearyl ether and polyoxyethylene oleyl ether, polyoxyethylene alkyl aryl ether compounds such as polyoxyethylene octyl phenol ether and polyoxyethylene nonyl phenol ether, polyoxyethylene/polyoxypropylene block copolymer compounds, sorbitan fatty acid ester compounds such as sorbitan monolaurate, sorbitan monopalmitate, sorbitan monostearate, sorbitan trioleate and sorbitan tristearate, polyoxyethylene sorbitan fatty acid ester compounds such as polyoxyethylene sorbitan monolaurate, polyoxyethylene sorbitan monopalmitate, polyoxyethylene sorbitan monostearate and polyoxyethylene sorbitan tristearate. The surfactants also include fluorine based surfactants, e.g., trade name: EFTOP EF301, EF303, EF352 (manufactured by Jemco Inc.), trade name: MEGAFAC F171, F173, R-08, R-30 (manufactured by DIC Corporation), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); and organosiloxane polymer KP341 (manufactured by Shin-Etsu Chemical Co., Ltd.). When the surfactant is used, the added amount is for example 0.1 to 5 mass % or 0.5 to 2 mass % based on 100 mass % of the polymerizable compound (A).

The sensitizers can be used in order to increase the sensitivity of the photopolymerization initiator to light. The sensitizers include for example, pyrromethene complex compounds such as 2,6-diethyl-1,3,5,7,8-pentamethyl pyrromethene-$BF_2$ complex and 1,3,5,7,8-pentamethyl pyrromethene-$BF_2$ complex, xanthene type coloring matters such as eosin, ethyleosin, erythrosin, fluorescein and rose bengal, ketothiazorine compounds such as 1-(1-methylnaphtho(1,2-d)thiazole-2(1H)-ylidene-4-(2,3,6,7)tetrahydro-1H, 5H-benzo(ij)quinolidine-9-yl)-3-butene-2-one, 1-(3-methyl-benzothiazole-2(3H)-ylidene-4-(p-dimethylaminophenyl)-3-butene-2-one, styryl or phenylbutadienyl heterocyclic compounds such as 2-(p-dimethylaminostyryl)-naphtho(1,2-d)thiazole, 2-(4-(p-dimethylaminophenyl)-1,3-butadienyl)-naphtho(1,2-d)thiazole. In addition, 2,4-diphenyl-6-(p-dimethylaminostyryl)-1,3,5-triazine, 2,4-diphenyl-6-(((2,3,6,7)tetrahydro-1H,5H-benzo(ij)quinolidine-9-yl)-1-ethene-2-yl)-1,3,5-triazonenanthryl-(((2,3,6,7)tetrahydro-1H,5H-benzo(ij)quinolidine-9-yl)-1-ethene-2-yl)ketone and 2,5-bis(p-dimethylaminocinnamylidene)cyclopentanone, 5,10,15, 20-tetraphenylporphyrin, etc. can be mentioned. When the sensitizer is used, the added amount is for example 0.1 to 20 mass % based on 100 mass % of the polymerizable compound (A).

The amine compounds can be used in order to prevent lowering in sensitivity due to oxygen inhibition of the above-mentioned photopolymerization initiator. As the amine compounds, several amine compounds such as aliphatic amine compounds and aromatic amine compounds can be used. When the amine compound is used, the added amount is for example 0.1 to 10 mass % based on 100 mass % of the polymerizable compound (A).

Further, in the present invention, polymer compounds containing a light absorption group having light absorption at a wavelength of 173 nm, 193 nm, 248 nm or 365 nm can be contained. The use of the polymer compound enables the control of refractive index, attenuation coefficient, and light absorbing property, etc. of the underlayer coating formed from the underlayer coating forming composition of the present invention. For example, the use of polymer compounds having benzene ring can enable an increase in the light absorbing property of the underlayer coating to ArF excimer laser (wavelength of 193 nm). In addition, for example, the use of polymer compounds having naphthalene ring or anthracene ring can enable an increase in the light absorbing property of the underlayer coating to KrF excimer laser (wavelength of 248 nm).

As the polymer compounds, several polymer compounds having a weight average molecular weight of about 1,000 to 1,000,000 can be used without any limitation to the kind. For example, acrylate polymers, methacrylate polymers, novolak polymers, styrene polymers, polyamides, polyamic acids, polyesters and polyimides having benzene ring, naphthalene ring or anthracene ring can be mentioned.

The polymer compounds excellent in light absorbing property that are used for anti-reflective coatings being an underlayer of photoresists in the lithography process of the manufacture of semiconductor devices can be also used. The use of such polymer compounds can enable an increase in performances as anti-reflective coatings of the underlayer coatings formed from the underlayer coating forming composition of the present invention.

When the polymer compound is used, the added amount is for example 0.1 to 50 mass % based on 100 mass % of the polymerizable compound (A).

The underlayer coating forming composition of the present invention is preferably used in a solution state in which each component of the polymerizable compound (A), photopolymerization initiator (B), etc. (hereinafter referred to as "solid content") is dissolved in a solvent (C). Solid content is residual moiety except the solvent in the underlayer coating forming composition.

As the solvent for preparing the above-mentioned solution, any solvents can be used as far as the solvents can dissolve the solid contents to give a homogeneous solution. When a condensate is obtained by hydrolyzing organosilicon compounds and the condensate is used as the polymerizable compound (A), it is preferable that an organic solvent used for hydrolyzing organosilicon compounds is directly used as a solvent (C) for the underlayer coating forming composition.

The solvents (C) include for example, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N-dimethylformamide, N-dimethylacetamide, dimethylsulfoxide and N-methylpyrrolidone. These solvents (C) may be used solely or in combination of two or more kinds. The solvents having a boiling point of 80 to 250° C., or 100 to 200° C., or 120 to 180° C. are preferably used. When the boiling point of the solvent is low, the vaporization of a large amount of the solvent during the application of the underlayer coating forming composition may cause an increase in viscosity and a lowering of application property. When the boiling point of the solvent is high, it is assumed to require a long time for drying after the application of the underlayer coating forming composition. The solvent can be used in an amount so that concentration of the solid content in the underlayer coating forming composition can be for example 0.5 to 50% by mass, or 3 to 40% by mass, or 10 to 30% by mass.

In the present invention, semiconductor devices are manufactured by including steps of applying the underlayer coating forming composition of the present invention on a semiconductor substrate to form an applied coating, and irradiating the applied coating with light to form an underlayer coating.

Semiconductor devices are manufactured by including steps of applying the underlayer coating forming composition of the present invention on a semiconductor substrate to form an applied coating and irradiating the applied coating with light to form an underlayer coating, applying a photoresist composition on the underlayer coating to form a photoresist by heating, exposing the semiconductor substrate coated with the underlayer coating and the photoresist to light, developing the photoresist after exposure to light to obtain a resist pattern, etching the underlayer coating according to the resist pattern, and processing the semiconductor substrate according to a patterned photoresist coating and a patterned underlayer coating.

Semiconductor devices are manufactured by including steps of
forming an organic coating using an application type organic coating forming composition on a semiconductor substrate, applying the underlayer coating forming composition of the present invention on the organic coating to form an underlayer coating, forming a photoresist coating on the underlayer coating, exposing the photoresist coating to light and developing the photoresist coating to form a resist pattern, etching the underlayer coating according to the resist pattern, etching the organic coating according to the patterned underlayer coating, and processing the semiconductor substrate according to the patterned organic coating.

The above-mentioned semiconductor substrate is a semiconductor substrate having hole of an aspect ratio shown in height/diameter of 1 or more.

Hereinafter, the use of the underlayer coating forming composition of the present invention is explained.

The underlayer coating forming composition of the present invention is coated by a suitable coating method, for example, with a spinner, a coater, onto a semiconductor substrate (for example silicon/silicon dioxide coated substrate, silicon wafer substrate, silicon nitride substrate, glass substrate, ITO substrate, polyimide substrate and low-dielectric constant (low-k) material-coated substrate) used for manufacturing of semiconductor devices to form an applied coating. Then, prior to light irradiation to the applied coating, a drying process can be included, if necessary. When the underlayer coating forming composition containing a solvent is used, it is preferable to perform a drying process.

The drying process is not specifically limited so long as heating at a high temperature is not carried out in the process. This is because it is assumed that heating at a high temperature (for example a temperature of 150° C. or more) causes sublimation and the like of the solid content contained in the applied coating that pollutes the apparatuses. The drying process can be performed by for example heating a substrate at 50 to 100° C. for 0.1 to 10 minutes on a hot plate. The drying process can be also performed by air-drying at room temperature (about 20° C.).

Then, light irradiation is performed to the applied coating. For the light irradiation, any methods can be used without any limitation so long as it can act to the above-mentioned photopolymerization initiator (B) and cause the polymerization of the polymerizable compound (A). For example, the light irradiation can be performed with an ultrahigh pressure mercury lamp, a flash UV lamp, a high pressure mercury lamp, a low pressure mercury lamp, a DEEP-UV (deep ultraviolet) lamp, a xenon short arc lamp, a short arc metal halide lamp, a YAG laser excitation lamp, and a xenon flash lamp. For the light irradiation, for example, an ultrahigh pressure mercury lamp is used, irradiation with light of whole wavelength ranging from about 250 nm to 650 nm including bright line spectrum having the following wavelength as peaks: 289 nm, 297 nm, 303 nm, 313 nm (j-line), 334 nm and 365 nm (i-line) belonging to ultraviolet region, and 405 nm (h-line), 436 nm (g-line), 546 nm and 579 nm belonging to visible ray region can be performed.

The light irradiation causes cation species or active radials from the photopolymerization initiator in the applied coating, and thereby the polymerization reaction of the polymerizable compound in the applied coating occurs. As a result of the polymerization reaction, an underlayer coating is formed. The resulting underlayer coating becomes low in solubility in a solvent used for photoresist composition applied thereon, for example, ethylene glycol monomethyl ether, ethyl cellosolve acetate, diethylene glycol monoethyl ether, propylene glycol, propylene glycol monomethyl ether, propylene glycol monomethyl ether acetate, propylene glycol propyl ether acetate, toluene, methyl ethyl ketone, cyclohexanone, ethyl 2-hydroxypropionate, ethyl 2-hydroxy-2-methylpropionate, ethyl ethoxy acetate, methyl pyruvate, ethyl lactate and butyl lactate. Therefore, an underlayer coating formed by the underlayer coating forming composition of the present invention do not intermix with a photoresist.

The underlayer coating forming composition of the present invention can be applied on a semiconductor substrate having holes of an aspect ratio shown in height (b)/diameter (a) of 1 or more, for example 1 to 10, or 2 to 5 as shown in FIG. 1. And, the underlayer coating forming composition of the present invention can be used for filling the holes without gap (void) with an underlayer coating. The underlayer coating forming composition of the present invention can be also applied on a semiconductor substrate having holes of an aspect ratio of 1 or more densely and thinly (a substrate containing a part having holes densely and a part having holes thinly). Further, the underlayer coating forming composition of the present invention can be used for forming a flat underlayer coating on the surface of a substrate on which such holes are present densely and thinly.

In addition, the underlayer coating forming composition of the present invention can be used also for a semiconductor substrate having holes of an aspect ratio less than 1, and a semiconductor substrate having unevenness. Further, it can be used also for a semiconductor having no unevenness and the like.

The underlayer coating formed from the underlayer coating forming composition of the present invention has a film thickness of for example 20 to 2,000 nm, or 30 to 1,000 nm, or 50 to 800 nm on the surface of a substrate.

Next, a photoresist is formed on the underlayer coating. Consequently, a laminate structure constituting of an underlayer coating and a photoresist is formed on a semiconductor substrate. The photoresist is formed by the known method, namely, by applying a photoresist composition solution onto the underlayer coating, and by heating. The photoresist to be formed on the underlayer coating of the present invention is not specifically limited, and any of negative type and positive type photoresists, which are used widely, can be used. The photoresist includes, for example, a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shin-Etsu Chemical Co., Ltd., and the like can be mentioned.

Subsequently, exposure to light is carried out through a predetermined mask. For the exposure to light, KrF excimer laser (wavelength of 248 nm), ArF excimer laser (wavelength of 193 nm), and F2 excimer laser (wavelength of 157 nm), may be used. If necessary, a post exposure bake may be performed after being exposed to light. The post exposure bake after being exposed to light is conducted by suitably selecting from heating temperature of 70 to 150° C., and a heating time of 0.3 to 10 minutes.

In the next phase, development is carried out by using a developer. For example, in case where a positive type photoresist is used, the development results in removal of exposed part of the photoresist and forming of a photoresist pattern.

The developer includes for example alkaline aqueous solution e.g., an aqueous solutions of alkali metal hydroxide such as potassium hydroxide and sodium hydroxide, aqueous solution of quaternary ammonium hydroxide such as tetramethylammonium hydroxide, tetraethylammonium hydroxide, and choline, amine aqueous solution such as ethanolamine, propylamine, and ethylenediamine. Additionally, surfactants can be added in the developer. The condition in which development takes place is suitably selected from a temperature ranging from 5 to 50° C. and time ranging from 0.1 to 5 minutes.

Then, the removal of the underlayer coating and processing of the semiconductor substrate are conducted by using the photoresist pattern formed as mentioned above as a protective coating. The removal of the underlayer coating is conducted through dry etching by use of a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, and chlorine trifluoride. The removal of the underlayer coating leads to the formation of a pattern consisting of an underlayer coating and a photoresist on a semiconductor substrate.

In the first method of preparing the underlayer coating as a hard mask made from the underlayer coating forming composition of the present invention, semiconductor devices are manufactured by including steps of applying the underlayer coating forming composition of the present invention on a semiconductor substrate to form an applied coating and irradiating the applied coating with light to form an underlayer coating, applying a photoresist composition on the underlayer coating to form a photoresist coating, exposing the photoresist coating to light, developing the photoresist after exposure to light to obtain a resist pattern, etching the underlayer coating according to the resist pattern, and processing the semiconductor substrate according to a patterned photoresist coating and a patterned underlayer coating. In this case, under $CF_4$ gas atmosphere condition used at photoresist etching, as the underlayer coating of the present invention has sufficiently high etching rate compared with the photoresist, the underlayer coating of the present invention can be removed by etching according to resist pattern and the semiconductor substrate can be processed by using the resist and the underlayer coating as protective coatings.

In the second method of preparing the underlayer coating made from the underlayer coating forming composition of the present invention as a hard mask, semiconductor devices are manufactured by including steps of forming an organic coating (gap filling material or spin-on carbon material) using an application type organic coating forming composition on a semiconductor substrate, applying the underlayer coating forming composition of the present invention on the organic coating and irradiating by light to form an underlayer coating, applying a photoresist composition on the underlayer coating to form a photoresist layer, exposing the photoresist coating to light, developing the photoresist after exposure to light to obtain a resist pattern, etching the underlayer coating according to the resist pattern, etching the organic coating according to a patterned underlayer coating, and processing the semiconductor substrate according to the patterned organic coating. In this case, under $CF_4$ gas atmosphere condition used at photoresist etching, as the underlayer coating of the present invention has sufficiently high etching rate compared with photoresist, the underlayer coating of the present invention can be removed by etching according to resist pattern and the photoresist pattern can be transferred to the underlayer coating of the present invention. Further, under $O_2$ (oxygen) gas atmosphere condition used at organic coating etching formed under the underlayer coating of the present invention, as the underlayer coating of the present invention has drastically low etching rate compared with the organic coating (having similar etching property to photoresist), the resist pattern transferred to the underlayer coating of the present invention can further be transferred to the organic coating and the semiconductor substrate can be processed by using the organic coating as a protective coating.

In addition, an anti-reflective coating layer can be formed before forming a photoresist on the underlayer coating of the present invention. The anti-reflective coating composition is not specifically limited, and any existing anti-reflective coating compositions can be used. For example, an anti-reflective coating can be formed by coating an anti-reflective coating forming composition conventionally used in the lithography process with the conventional method, for example, with a spinner or a coater, and baking. The anti-reflective coating composition includes for example one containing as main components a light absorbing compound, a resin and a solvent, one containing as main components a resin having a light absorbing group through chemical bond, a crosslinking agent and a solvent, one containing as main components a light absorbing compound, a crosslinking agent and a solvent, and one containing as main components a polymer type crosslinking agent having a light absorbing property and a solvent. The anti-reflective coating composition may contain an acid component, an acid generator component, a rheology controlling agent, or the like, if necessary. The light absorbing compounds that can be used are any compounds having a high absorption ability for light at photosensitive characteristic wavelength region of the photosensitive component in the photoresist provided on the anti-reflective coating, and include for example benzophenone compounds, benzotriazole compounds, azo compounds, naphthalene compounds, anthracene compounds, anthraquinone compounds, triazine compounds. The resins include polyesters, polyimides, polystyrenes, novolak resins, polyacetal resins, acrylic resins, and the like. The resins having a light absorbing group through chemical bond include resins having a light absorbing aromatic ring structure such as anthracene ring, naphthalene ring, benzene ring, quinoline ring, quinoxaline ring, thiazole ring.

Further, prior to coating of the underlayer coating forming composition of the present invention, an anti-reflective coating or a flattening coating can be formed on a semiconductor substrate.

The underlayer coating formed by the underlayer coating forming composition of the present invention may have absorption for light in some wavelength of light used in the process of lithography. In such a case, the underlayer coating of the present invention can function as a layer that provides preventive effect towards the light reflected by the substrate, namely, as an anti-reflective coating. The underlayer coating of the present invention can be used further as a layer for preventing an interaction between the substrate and the photoresist, as a layer having a function that prevents an adverse effect against the semiconductor substrate by the material used for the photoresist or by substances formed on exposure to light of the photoresist, and as a layer having a function that prevents diffusion of substances formed in the semiconductor substrate on baking under heating to the upper layer photoresist, and the like.

Hereinafter, the present invention will be described more specifically based on examples but the present invention is not limited thereto.

EXAMPLES

Example 1

To 19.32 g of ethyl lactate, 2.0 g of 3-(acryloxypropyl) trimethoxy silane (manufactured by AZmax.co.), 0.0768 g of water and 0.147 g of p-toluenesulfonic acid were added and stirred for 3 hours at room temperature to hydrolyze 3-(acryloxypropyl) trimethoxy silane and to obtain a condensate thereof.

Then, 0.25 g of a photopolymerization initiator: 2,2-dimethoxy-1,2-diphenyethane-1-one (manufactured by Chiba Specialty Chemicals, trade name: Irgacure651) and 0.05 g of a surfactant (manufactured by DIC Corporation, trade name: Megafac R30) were added to the obtained solution to prepare a solution of 10% by mass in ethyl lactate. Then, the solution was filtered through a micro filter made of polyethylene having a pore size of 0.2 μm to prepare a solution of an underlayer coating forming composition.
(Dissolution Test in Photoresist Solvent)

The solutions of underlayer coating forming compositions obtained in Example 1 was coated on a semiconductor substrate (a silicon wafer substrate) by means of a spinner to form applied coatings. The applied coatings were irradiated with an ultrahigh pressure mercury lamp (manufactured by Ushio Inc., type UIS-5011MIKY, output: 500 W) by whole wavelength transmitted through a band pass filter of 248 nm of the lamp (an exposure value of 450 mJ/cm$^2$). In order to remove the solvent and dry, the substrates were heated at 100° C. for 1 minute on a hot plate to form underlayer coatings (film thickness 190 mm). Then, the underlayer coatings were dipped in ethyl lactate and propylene glycol monomethyl ether being solvents used for photoresists, and as a result it was confirmed that the resulting underlayer coatings were insoluble in these solvents.
(Test of Intermixing with Photoresist)

Similarly to the above, the underlayer coating (film thickness 190 nm) on a silicon wafer substrate was formed from the solution of underlayer coating forming compositions obtained in Example 1. On the upper layer of the underlayer coating was coated a photoresist solution (manufactured by Shipley Company, trade name: APEX-E) by means of a spinner. The coated wafers were heated at 90° C. for 1 minute on a hot plate to form a photoresist. After exposure of the photoresist to light, post exposure bake was performed at 90° C. for 1.5 minute. After developing the photoresist, the film thickness of the underlayer coating was measured and it was confirmed that no intermixing occurred between the underlayer coating and the photoresist.
(Measurements of Optical Parameters)

Similarly to the above, the underlayer coating (film thickness 190 nm) on a silicon wafer substrate was formed from the solution of the underlayer coating forming compositions obtained in Example 1. Refractive index (n value) and attenuation coefficient (k value) of the underlayer coating at a wavelength of 193 nm were measured with a spectroscopic ellipsometer. As a result, refractive index was 1.64 and attenuation coefficient was 0.150.
(Test of Dry Etching Rate)

Similarly to the above, the underlayer coating (film thickness 190 nm) on a silicon wafer substrate was formed from the solution of underlayer coating forming compositions obtained in Example 1. Then, dry etching rate (decrease in film thickness per unit time) on the underlayer coating was measured with RIE system ES401 manufactured by Nippon Scientific Co., Ltd. under the condition in which $O_2$ and $CF_4$ were used as dry etching gases. The obtained result showed as selectivity corresponds to dry etching rate. The selectivity ratio that corresponds to dry etching rate is a ratio of dry etching rate of an underlayer coating in case where the dry etching rate under a similar condition to the photoresist for KrF laser lithography (trade name: SEPR430 manufactured by Shin-Etsu Chemical Co., Ltd.) is regarded as 1.00.

The selectivity ratio corresponds to etching rate when $O_2$ was used as dry etching gas was zero, and no etching occurred. On the other hand, the selectivity ratio corresponds to etching rate when $CF_4$ was used was 1.6.

Example 2

To 114.99 g of ethyl lactate, 10.0 g of vinyl trimethoxy silane (manufactured by AZmax.co.), 1.486 g of phenyl trimethoxy silane (manufactured by AZmax.co.), 0.6746 g of water and 1.290 g of p-toluenesulfonic acid were added and stirred for 3 hours at room temperature to hydrolyze vinyl trimethoxy silane and phenyl trimethoxy silane, and to obtain a condensate thereof.

Then, 1.00 g of a photopolymerization initiator: 2,2-dimethoxy-1,2-diphenyethane-1-one (manufactured by Chiba Specialty Chemicals, trade name: Irgacure651) and 0.20 g of a surfactant (manufactured by DIC Corporation, trade name: Megafac R30) were added to the obtained solution to prepare a solution of 10% by mass in ethyl lactate. Then, the solution was filtered through a micro filter made of polyethylene having a pore size of 0.2 μm to prepare a solution of an underlayer coating forming composition.

(Dissolution Test in Photoresist Solvent)

The solutions of underlayer coating forming compositions obtained in Example 2 was coated on a semiconductor substrate (a silicon wafer substrate) by means of a spinner to form applied coatings. The applied coatings were irradiated with an ultrahigh pressure mercury lamp (manufactured by Ushio Inc., type UIS-5011MIKY, output: 500 W) by whole wavelength transmitted through a band pass filter of 248 nm of the lamp (an exposure value of 450 mJ/cm$^2$). In order to remove the solvent and dry, the substrates were heated at 100° C. for 1 minute on a hot plate to form underlayer coatings (film thickness 190 nm). Then, the underlayer coatings were dipped in ethyl lactate and propylene glycol monomethyl ether being solvents used for photoresists, and as a result it was confirmed that the resulting underlayer coatings were insoluble in these solvents.

(Test of Intermixing with Photoresist)

Similarly to the above, the underlayer coating (film thickness 190 nm) on a silicon wafer substrate was formed from the solution of underlayer coating forming compositions obtained in Example 2. On the upper layer of the underlayer coating was coated a photoresist solution (manufactured by Shipley Company, trade name: APEX-E) by means of a spinner. The coated wafers were heated at 90° C. for 1 minute on a hot plate to form a photoresist. After exposure of the photoresist to light, post exposure bake was performed at 90° C. for 1.5 minute. After developing the photoresist, the film thickness of the underlayer coating was measured and it was confirmed that no intermixing occurred between the underlayer coating and the photoresist.

(Measurements of Optical Parameters)

Similarly to the above, the underlayer coating (film thickness 190 nm) on a silicon wafer substrate was formed from the solution of underlayer coating forming compositions obtained in Example 2. Refractive index (n value) and attenuation coefficient (k value) of the underlayer coating at a wavelength of 193 nm were measured with a spectroscopic ellipsometer. As a result, refractive index was 1.82 and attenuation coefficient was 0.20.

(Test of Dry Etching Rate)

Similarly to the above, the underlayer coating (film thickness 190 nm) on a silicon wafer substrate was formed from the solution of underlayer coating forming compositions obtained in Example 2. Then, dry etching rate (decrease in film thickness per unit time) on the underlayer coating was measured with RIE system ES401 manufactured by Nippon Scientific Co., Ltd. under the condition in which $O_2$ and $CF_4$ were used as dry etching gases. The obtained result showed as selectivity corresponds to dry etching rate. The selectivity ratio that corresponds to dry etching rate is ratio of dry etching rate of an underlayer coating in case where the dry etching rate under a similar condition to the photoresist for KrF laser lithography (trade name: SEPR430 manufactured by Shin-Etsu Chemical Co., Ltd.) is regarded as 1.00.

The selectivity ratio corresponds to etching rate when $O_2$ was used as dry etching gas was zero, and no etching occurred. On the other hand, the selectivity ratio corresponds to etching rate when $CF_4$ was used was 1.5.

Example 3

To 114.99 g of ethyl lactate, 10.0 g of vinyl trimethoxy silane (manufactured by AZmax.co.), 1.486 g of phenyl trimethoxy silane (manufactured by AZmax.co.), 0.6746 g of water and 1.290 g of p-toluenesulfonic acid were added and stirred for 3 hours at room temperature to hydrolyze vinyl trimethoxy silane and phenyl trimethoxy silane, and to obtain a condensate thereof.

Then, 1.00 g of a photopolymerization initiator: triphenylsulfonium trifluoromethane sulfonate (manufactured by Midori Kagaku Co., Ltd., trade name: TPS105) and 0.20 g of a surfactant (manufactured by DIC Corporation, trade name: Megafac R30) were added to the obtained solution to prepare a solution of 10% by mass. Then, the solution was filtered through a micro filter made of polyethylene having a pore size of 0.2 µm to prepare a solution of an underlayer coating forming composition.

(Dissolution Test in Photoresist Solvent)

The solutions of underlayer coating forming compositions obtained in Example 3 was coated on a semiconductor substrate (a silicon wafer substrate) by means of a spinner to form applied coatings. The applied coatings were irradiated with an ultrahigh pressure mercury lamp (manufactured by Ushio Inc., type UIS-5011MIKY, output: 500 W) by whole wavelength transmitted through a band pass filter of 248 nm of the lamp (an exposure value of 450 mJ/cm$^2$). In order to remove the solvent and dry, the substrates were heated at 100° C. for 1 minute on a hot plate to form underlayer coatings (film thickness 190 nm). Then, the underlayer coatings were dipped in ethyl lactate and propylene glycol monomethyl ether being solvents used for photoresists, and as a result it was confirmed that the resulting underlayer coatings were insoluble in these solvents.

(Test of Intermixing with Photoresist)

Similarly to the above, the underlayer coating (film thickness 190 nm) on a silicon wafer substrate was formed from the solution of underlayer coating forming compositions obtained in Example 3. On the upper layer of the underlayer coating was coated a photoresist solution (manufactured by Shipley Company, trade name: APEX-E) by means of a spinner. The coated wafers were heated at 90° C. for 1 minute on a hot plate to form a photoresist. After exposure of the photoresist to light, post exposure bake was performed at 90° C. for 1.5 minute. After developing the photoresist, the film thickness of the underlayer coating was measured and it was confirmed that no intermixing occurred between the underlayer coating and the photoresist.

(Measurements of Optical Parameters)

Similarly to the above, the underlayer coating (film thickness 190 nm) on a silicon wafer substrate was formed from the solution of underlayer coating forming compositions obtained in Example 3. Refractive index (n value) and attenuation coefficient (k value) of the underlayer coating at a wavelength of 193 nm were measured with a spectroscopic ellipsometer. As a result, refractive index was 1.82 and attenuation coefficient was 0.20.

(Test of Dry Etching Rate)

Similarly to the above, the underlayer coating (film thickness 190 µm) on a silicon wafer substrate was formed from the solution of underlayer coating forming compositions obtained in Example 3. Then, dry etching rate (decrease in film thickness per unit time) on the underlayer coating was measured with RIE system ES401 manufactured by Nippon Scientific Co., Ltd. under the condition in which $O_2$ and $CF_4$ were used as dry etching gases. The obtained result showed as selectivity corresponds to dry etching rate. The selectivity ratio corresponds to dry etching rate is ratio of dry etching rate of an underlayer coating in case where the dry etching rate under a similar condition to the photoresist for KrF laser lithography (trade name: SEPR430 manufactured by Shin-Etsu Chemical Co., Ltd.) is regarded as 1.00.

The selectivity ratio corresponds to etching rate when $O_2$ was used as dry etching gas was zero, and no etching occurred. On the other hand, the selectivity ratio corresponds to etching rate when $CF_4$ was used was 1.5.

Example 4

To 101.7 g of propylene glycol monomethyl acetate, 10.0 g of bis(2-(3,4-epoxycyclohexyl)ethyl) tetramethyl disiloxane (manufactured by AZmax.co.), 1.30 g of 3-ethyl-3-hydrorxymethyl oxetane (manufactured by Toagosei Co., Ltd., trade name: OXT-101) were added and stirred for 3 hours at room temperature.

Then, 1.00 g of a photopolymerization initiator: 4-methylphenyl(4-(1-methylethyl)phenyl)iodonium tetrakis(pentafluorophenyl) borate (manufactured by Rhodia Japan Ltd., trade name: PI2074) and 0.20 g of a surfactant (manufactured by DIC Corporation, trade name: Megafac R30) were added to the obtained solution to prepare a solution of 10% by mass. Then, the solution was filtered through a micro filter made of polyethylene having a pore size of 0.2 μm to prepare a solution of an underlayer coating forming composition.

(Dissolution Test in Photoresist Solvent)

The solutions of underlayer coating forming compositions obtained in Example 4 was coated on a semiconductor substrate (a silicon wafer substrate) by means of a spinner to form applied coatings. The applied coatings were irradiated with an ultrahigh pressure mercury lamp (manufactured by Ushio Inc., type UIS-5011MIKY, output: 500 W) by whole wavelength transmitted through a band pass filter of 248 nm of the lamp (an exposure value of 450 mJ/cm$^2$). In order to remove the solvent and dry, the substrates were heated at 100° C. for 1 minute on a hot plate to form underlayer coatings (film thickness 190 nm). Then, the underlayer coatings were dipped in ethyl lactate and propylene glycol monomethyl ether being solvents used for photoresists, and as a result it was confirmed that the resulting underlayer coatings were insoluble in these solvents.

(Test of Intermixing with Photoresist)

Similarly to the above, the underlayer coating (film thickness 190 nm) on a silicon wafer substrate was formed from the solution of underlayer coating forming compositions obtained in Example 4. On the upper layer of the underlayer coating was coated a photoresist solution (manufactured by Shipley Company, trade name: APEX-E) by means of a spinner. The coated wafers were heated at 90° C. for 1 minute on a hot plate to form a photoresist. After exposure of the photoresist to light, post exposure bake was performed at 90° C. for 1.5 minute. After developing the photoresist, the film thickness of the underlayer coating was measured and it was confirmed that no intermixing occurred between the underlayer coating and the photoresist.

(Measurements of Optical Parameters)

Similarly to the above, the underlayer coating (film thickness 190 nm) on a silicon wafer substrate was formed from the solution of underlayer coating forming compositions obtained in Example 4. Refractive index (n value) and attenuation coefficient (k value) of the underlayer coating at a wavelength of 193 nm were measured with a spectroscopic ellipsometer. As a result, refractive index was 1.69 and attenuation coefficient was 0.03.

(Test of Dry Etching Rate)

Similarly to the above, the underlayer coating (film thickness 190 μm) on a silicon wafer substrate was formed from the solution of underlayer coating forming compositions obtained in Example 4. Then, dry etching rate (decrease in film thickness per unit time) on the underlayer coating was measured with RIE system ES401 manufactured by Nippon Scientific Co., Ltd. under the condition in which $O_2$ and $CF_4$ were used as dry etching gases. The obtained result showed as selectivity corresponds to dry etching rate. The selectivity ratio that corresponds to dry etching rate is ratio of dry etching rate of an underlayer coating in the case where the dry etching rate under a similar condition to the photoresist for KrF laser lithography (trade name: SEPR430 manufactured by Shin-Etsu Chemical Co., Ltd.) is regarded as 1.00.

The selectivity ratio corresponds to etching rate when $O_2$ was used as dry etching gas was 0.6, while the selectivity ratio corresponds to etching rate when $CF_4$ was used was 1.3.

Example 5

To 96.40 g of ethyl lactate, 10.0 g of γ-glycidoxypropyl trimethoxy silane (manufactured by AZmax.co.), 0.366 g of water and 0.6999 g of p-toluenesulfonic acid were added and stirred for 3 hours at room temperature to hydrolyze γ-glycidoxypropyl trimethoxy silane, and to obtain a condensate thereof.

Then, 1.00 g of a photopolymerization initiator: 4-methylphenyl(4-(1-methylethyl)phenyl)iodonium tetrakis(pentafluorophenyl) borate (manufactured by Rhodia Japan Ltd., trade name: PI2074) and 0.20 g of a surfactant (manufactured by DIC Corporation, trade name: Megafac R30) were added to the condensate to prepare a solution of 10% by mass. Then, the solution was filtered through a micro filter made of polyethylene having a pore size of 0.2 μm to prepare a solution of an underlayer coating forming composition.

(Dissolution Test in Photoresist Solvent)

The solutions of underlayer coating forming compositions obtained in Example 5 was coated on a semiconductor substrate (a silicon wafer substrate) by means of a spinner to form applied coatings. The applied coatings were irradiated with an ultrahigh pressure mercury lamp (manufactured by Ushio Inc., type UIS-5011MIKY, output: 500 W) by whole wavelength transmitted through a band pass filter of 248 nm of the lamp (an exposure value of 450 mJ/cm$^2$). In order to remove the solvent and dry, the substrates were heated at 100° C. for 1 minute on a hot plate to form underlayer coatings (film thickness 190 nm). Then, the underlayer coatings were dipped in ethyl lactate and propylene glycol monomethyl ether being solvents used for photoresists, and as a result it was confirmed that the resulting underlayer coatings were insoluble in these solvents.

(Test of Intermixing with Photoresist)

Similarly to the above, the underlayer coating (film thickness 190 nm) on a silicon wafer substrate was formed from the solution of underlayer coating forming compositions obtained in Example 5. On the upper layer of the underlayer coating was coated a photoresist solution (manufactured by Shipley Company, trade name: APEX-E) by means of a spinner. The coated wafers were heated at 90° C. for 1 minute on a hot plate to form a photoresist. After exposure of the photoresist to light, post exposure bake was performed at 90° C. for 1.5 minute. After developing the photoresist, the film thickness of the underlayer coating was measured and it was confirmed that no intermixing occurred between the underlayer coating and the photoresist.

(Measurements of Optical Parameters)

Similarly to the above, the underlayer coating (film thickness 190 nm) on a silicon wafer substrate was formed from the solution of underlayer coating forming compositions obtained in Example 5. Refractive index (n value) and attenuation coefficient (k value) of the underlayer coating at a wavelength of 193 nm were measured with a spectroscopic ellipsometer. As a result, refractive index was 1.83 and attenuation coefficient was 0.03.

(Test of Dry Etching Rate)

Similarly to the above, the underlayer coating (film thickness 190 μm) on a silicon wafer substrate was formed from the solution of underlayer coating forming compositions obtained in Example 5. Then, dry etching rate (decrease in film thickness per unit time) on the underlayer coating was measured with RIE system ES401 manufactured by Nippon Scientific Co., Ltd. under the condition in which $O_2$ and $CF_4$ were used as dry etching gases. The obtained result showed as selectivity corresponds to dry etching rate. The selectivity ratio corresponds to dry etching rate is ratio of dry etching rate of an underlayer coating in case where the dry etching rate under a similar condition to the photoresist for KrF laser lithography (trade name: SEPR430 manufactured by Shin-Etsu Chemical Co., Ltd.) is regarded as 1.00.

The selectivity ratio corresponds to etching rate when $O_2$ was used as dry etching gas was zero, and no etching occurred. On the other hand, the selectivity ratio corresponds to etching rate when $CF_4$ was used was 1.5.

DESCRIPTION OF SYMBOLS

Figure 1:
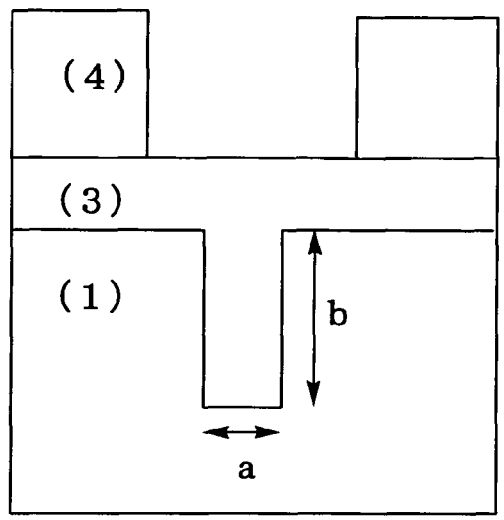
FIG. 1 is a sectional view of an underlayer coating made of an underlayer coating forming composition of the present invention and a photoresist coating formed on a semiconductor substrate having holes.
Figure 2:
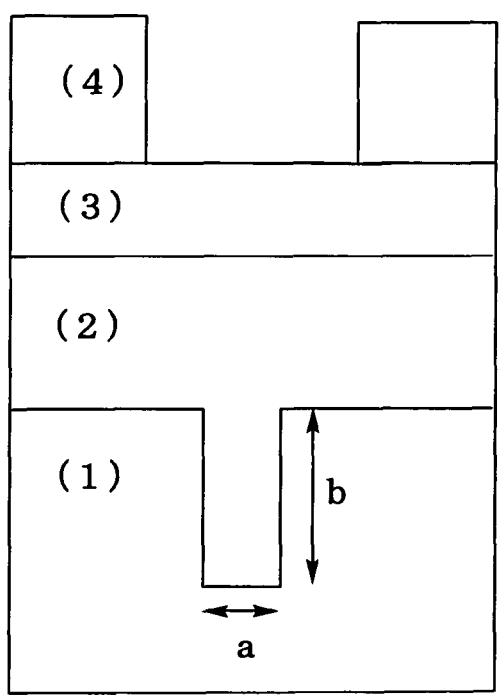
FIG. 2 is a sectional view of an organic coating, an underlayer coating made of an underlayer coating forming composition of the present invention and a photoresist coating formed on a semiconductor substrate having holes.

Symbol (1) is the processed substrate.
Symbol (2) is the organic coating.
Symbol (3) is the underlayer coating made of the underlayer coating forming composition of the present invention.
Symbol (4) is the photoresist coating.
Symbol (a) is the diameter of the hole on the semiconductor substrate used.
Symbol (b) is the depth of the hole on the semiconductor substrate used.

The invention claimed is:

1. A method for manufacturing a semiconductor device, comprising:
    applying an organic coating forming composition on a substrate to form an organic coating;
    applying an underlayer coating forming composition on the organic coating to form an applied coating and irradiating the applied coating with light to form an underlayer coating,
    wherein the underlayer coating forming composition comprises:
        a polymerizable compound containing 5 to 45% by mass of silicon atom (A),
        a photopolymerization initiator (B), and
        a solvent (C);
    applying a photoresist composition on the underlayer coating to form a photoresist coating;
    exposing the photoresist coating to light;
    developing the photoresist after exposure to light to obtain a resist pattern;
    etching the underlayer coating according to the resist pattern;
    etching the organic coating according to the patterned underlayer coating; and
    processing the semiconductor substrate according to the patterned organic coating.

2. The method for manufacturing a semiconductor device according to claim 1, wherein
    the polymerizable compound (A) is a polymerizable compound having at least one cationic polymerizable reactive group; and
    the photopolymerization initiator (B) is a photo-cationic polymerization initiator.

3. The method for manufacturing a semiconductor device according to claim 2, wherein the cationic polymerizable reactive group is an epoxy group.

4. The method for manufacturing a semiconductor device according to claim 1, wherein
    the polymerizable compound (A) is a polymerizable compound having at least one radical polymerizable ethylenically unsaturated bond; and
    the photopolymerization initiator (B) is a photo-radical polymerization initiator.

5. The method for manufacturing a semiconductor device according to claim 4, wherein the ethylenically unsaturated bond is a vinyl group.

6. The method for manufacturing a semiconductor device according to claim 1, wherein the polymerizable compound (A) containing silicon atom is at least one polymerizable compound (A1) containing silicon atom selected from a group consisting of an organosilicon compound represented by formula (I):

$$(R^1)_a(R)_b Si(R^2)_{4-(a+b)} \quad (I)$$

in formula (I), $R^1$ is an epoxy group, a vinyl group or a polymerizable organic group having these groups and these groups are bonded to silicon atom through a Si—C bond; $R^3$ is an alkyl group, an aryl group, a halogenated alkyl group, a halogenated aryl group, or an organic group having a mercapto group, an amino group or a cyano group and these groups are bonded to silicon atom through a Si—C bond; $R^2$ is halogen atom, or an alkoxy group, an alkoxyalkyl group or an alkoxyacyl group having 1 to 8 carbon atom(s), a is an integer of 1, b is an integer of 0, 1 or 2, and a+b is an integer of 1, 2 or 3, and formula (II):

$$((R^4)_c Si(R^5)_{3-c})_2 Y \quad (II)$$

in formula (II), $R^4$ is an epoxy group, a vinyl group or a polymerizable organic group having these groups and these groups are bonded to silicon atom through a Si—C bond; $R^5$ is an alkyl group, an aryl group, a halogenated alkyl group, a halogenated aryl group, or an organic group having a mercapto group, an amino group or a cyano group and these groups are bonded to silicon atom through a Si—C bond; Y is oxygen atom, a methylene group or an alkylene group having 2 to 20 carbon atoms and c is an integer of 1 or 2, a hydrolyzed compound thereof and a condensate thereof.

7. The method for manufacturing a semiconductor device according to claim 1, wherein the polymerizable compound (A) containing silicon atom is a combination of at least one polymerizable compound (A1) containing silicon atom selected from a group consisting of an organosilicon compound represented by the formula (I):

$$(R^1)_a(R)_b Si(R^2)_{4-(a+b)} \quad (I)$$

in formula (I), $R^1$ is an epoxy group, a vinyl group or a polymerizable organic group having these groups and these groups are bonded to silicon atom through a Si—C bond; $R^3$ is an alkyl group, an aryl group, a halogenated alkyl group, a halogenated aryl group, or an organic group having a mercapto group, an amino group or a cyano group and these groups are bonded to silicon atom through a Si—C bond; $R^2$ is halogen atom, or an alkoxy group, an alkoxyalkyl group or an alkoxyacyl group having 1 to 8 carbon atom(s), a is an integer of 1, b is an integer of 0, 1 or 2, and a+b is an integer of 1, 2 or 3, and (II):

$$((R^4)_c Si(R^5)_{3-c})_2 Y \qquad (II)$$

in formula (II), $R^4$ is an epoxy group, a vinyl group or a polymerizable organic group having these groups and these groups are bonded to silicon atom through a Si—C bond; $R^5$ is an alkyl group, an aryl group, a halogenated alkyl group, a halogenated aryl group, or an organic group having a mercapto group, an amino group or a cyano group and these groups are bonded to silicon atom through a Si—C bond; Y is oxygen atom, a methylene group or an alkylene group having 2 to 20 carbon atoms and c is an integer of 1 or 2, a hydrolyzed compound thereof and a condensate thereof and at least one polymerizable compound (A2) containing silicon atom selected from a group consisting of an organosilicon compound represented by formula (III):

$$(R^6)_d(R^8)_e Si(R^7)_{4-(d+e)} \qquad (III)$$

in formula (III), each of $R^6$ and $R^8$ is an alkyl group, an aryl group, a halogenated alkyl group, a halogenated aryl group, or an organic group having a mercapto group, an amino group or a cyano group and these groups are bonded to silicon atom through a Si—C bond; $R^7$ is halogen atom, or an alkoxy group, an alkoxyalkyl group or an alkoxyacyl group having 1 to 8 carbon atom(s), d and e are integers of 0, 1 or 2, and d+e is an integer of 0, 1 or 2, and formula (IV):

$$((R^9)_f Si(X)_{3-f})_2 Z \qquad (IV)$$

in formula (IV), $R^9$ is alkyl group having 1 to 5 carbon atom(s); X is an alkoxy group, an alkoxyalkyl group or an alkoxyacyl group having 1 to 4 carbon atom(s); Z is a methylene group or an alkylene group having 2 to 20 carbon atoms and f is an integer of 0 or 1, a hydrolyzed compound thereof and a condensate thereof.

8. The method for manufacturing a semiconductor device according to claim 6, wherein the polymerizable compound (A) containing silicon atom includes the compound (A1) or a combination of the compound (A1) and a compound (A2) containing silicon atom selected from a group consisting of an organosilicon compound represented by formula (III):

$$(R^6)_d(R^8)_e Si(R^7)_{4-(d+e)} \qquad (III)$$

in formula (III), each of $R^6$ and $R^8$ is an alkyl group, an aryl group, a halogenated alkyl group, a halogenated aryl group, or an organic group having a mercapto group, an amino group or a cyano group and these groups are bonded to silicon atom through a Si—C bond; $R^7$ is halogen atom, or an alkoxy group, an alkoxyalkyl group or an alkoxyacyl group having 1 to 8 carbon atom(s), d and e are integers of 0, 1 or 2, and d+e is an integer of 0, 1 or 2, and formula (IV):

$$((R^9)_f Si(X)_{3-f})_2 Z \qquad (IV)$$

in formula (IV), $R^9$ is alkyl group having 1 to 5 carbon atom(s); X is an alkoxy group, an alkoxyalkyl group or an alkoxyacyl group having 1 to 4 carbon atom(s); Z is a methylene group or an alkylene group having 2 to 20 carbon atoms and f is an integer of 0 or 1, and is a condensate haring a polymerizable organic group of a weight average molecular weight of 100 to 100,000, and being prepared by hydrolyzing an organosilicon compound in a molar ratio of (A1):(A2) from 100:0 to 100:50 and condensing the hydrolyzed organosilicon compound.

9. The method for manufacturing a semiconductor device according to claim 6, wherein the polymerizable compound (A) containing silicon atom is a condensate having a polymerizable organic group of a weight average molecular weight of 100 to 1,000,000 and prepared by hydrolyzing an organosilicon compound containing 5-75% by mass of organosilicon compound selected from organosilicon compounds represented by the formula (I) or a combination of the formula (I) and the formula (III):

$$(R^6)_d(R^8)_e Si(R^7)_{4-(d+e)} \qquad (III)$$

in formula (III), each of $R^6$ and $R^8$ is an alkyl group, an aryl group, a halogenated alkyl group, a halogenated aryl group, or an organic group having a mercapto group, an amino group or a cyano group and these groups are bonded to silicon atom through a Si—C bond; $R^7$ is halogen atom, or an alkoxy group, an alkoxyalkyl group or an alkoxyacyl group having 1 to 8 carbon atom(s), d and e are integers of 0, 1 or 2, and d+e is an integer of 1 and condensing the hydrolyzed organosilicon compound.

10. The method for manufacturing a semiconductor device according to claim 1, further comprising a polymer compound containing a light absorption group having light absorption at a wavelength of 173 nm, 193 nm, 248 nm or 365 nm.

* * * * *